United States Patent
Nakagawa et al.

(10) Patent No.: US 7,528,207 B2
(45) Date of Patent: May 5, 2009

(54) METHOD FOR PRODUCING POLYMER, POLYMER, COMPOSITION FOR FORMING INSULATING FILM, METHOD FOR PRODUCING INSULATING FILM, AND INSULATING FILM

(75) Inventors: Hisashi Nakagawa, Tsukuba (JP); Masahiro Akiyama, Tsukuba (JP); Takahiko Kurosawa, Tsukuba (JP); Atsushi Shiota, Sunnyvale, CA (US)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 11/485,508

(22) Filed: Jul. 13, 2006

(65) Prior Publication Data

US 2007/0021580 A1 Jan. 25, 2007

Related U.S. Application Data

(63) Continuation of application No. PCT/JP2005/000373, filed on Jan. 14, 2005.

(30) Foreign Application Priority Data

Jan. 16, 2004 (JP) .............................. 2004-009205

(51) Int. Cl.
C08G 77/50 (2006.01)
(52) U.S. Cl. .......................................... 528/21; 528/35
(58) Field of Classification Search ................... 528/21, 528/35
See application file for complete search history.

(56) References Cited

U.S. PATENT DOCUMENTS

| | | | |
|---|---|---|---|
| 4,220,600 A | | 9/1980 | Yajima et al. |
| 6,780,498 B2 * | | 8/2004 | Nakata et al. ............ 428/312.6 |
| 6,809,041 B2 | | 10/2004 | Interrante et al. |
| 6,844,568 B2 * | | 1/2005 | Seki et al. ..................... 257/64 |
| 2004/0007753 A1 | | 1/2004 | Seki et al. |
| 2005/0096415 A1 | | 5/2005 | Akiyama et al. |
| 2006/0006541 A1 | | 1/2006 | Tsuchiya et al. |
| 2006/0024980 A1 | | 2/2006 | Tsuchiya et al. |
| 2006/0210812 A1 | | 2/2006 | Shiota |
| 2007/0021580 A1 | | 1/2007 | Nakagawa et al. |

FOREIGN PATENT DOCUMENTS

| | | | |
|---|---|---|---|
| DE | 101 54 771 | * | 10/2002 |
| JP | 54-61299 | | 5/1979 |
| JP | 58 72923 | * | 5/1983 |
| JP | 5-105759 | * | 4/1993 |
| JP | 5-105761 | * | 4/1993 |
| JP | 5-263045 | | 10/1993 |
| JP | 5-315319 | | 11/1993 |
| JP | 11-340219 | | 12/1999 |
| JP | 11-340220 | | 12/1999 |
| JP | 2000-309752 | | 11/2000 |
| JP | 2001-127152 | | 5/2001 |
| JP | 2001-345317 | | 12/2001 |
| JP | 2003-115482 | | 4/2003 |
| JP | 2005-76031 | | 3/2005 |
| WO | WO 02/098955 | | 12/2002 |

OTHER PUBLICATIONS

English language abstract JP 58 72923, May 1983.*
English language abstract JP 5-105761 Apr. 1993.*
English language abstract JP 5-105759 Apr. 1993.*
Machine generated translation JP 05-105761.*
English language translation JP 05 105761, Apr. 27, 1993.*
Starfire Systems, "Starfire® SP-DEPCS," Starfire Systems, starfiresystems.com, Malta, NY, May 2005, pp. 1.
Starfire Systems, "Starfire® SP-DMPCS," Starfire Systems, starfiresystems.com, Malta, NY, May 2005, pp. 1.
Starfire Systems, "Specialty Chemicals," 1, Starfire Systems, Malta, NY, pp. 1.
Starfire Systems, "Specialty Chemicals," 2, Starfire Systems, Malta, NY, pp. 1.
Starfire Systems, "Internet Archive Wayback Machine," Starfire Systems, http://web.archive.org/web/*/http:www.starfiresystems.com, Malta, NY, Mar. 16, 2007, pp. 1.
Starfire Systems, "Starfire Systems: Projects, Specialty Chemicals," Starfire Systems:Specialty Chemicals, Organosilanes, http://web.archive.org/web/20011205120755/www.starfiresystems.com/projects/chemicals.html, Malta, NY, Mar. 16, 2007, pp. 1-2.
U.S. Appl. No. 11/596,295, filed Nov. 13, 2006, Akiyama et al.

(Continued)

*Primary Examiner*—Margaret G Moore
(74) *Attorney, Agent, or Firm*—Oblon, Spivak, McClelland, Maier & Neustadt, P.C.

(57) ABSTRACT

A method of producing a polymer includes hydrolyzing and condensing a hydrolyzable-group-containing silane monomer (B) in the presence of one or more polycarbosilanes (A), at least one of the polycarbosilanes (A) being a polycarbosilane (I) having a weight average molecular weight of 500 or more and obtained by reacting a compound of the following general formula (1) in the presence of at least one of an alkali metal and an alkaline earth metal,

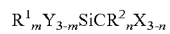

$$R^1_m Y_{3-m} SiCR^2_n X_{3-n} \qquad (1)$$

wherein $R^1$ and $R^2$ individually represent a monovalent organic group or a hydrogen atom, X represents a halogen atom, Y represents a halogen atom or an alkoxy group, and m and n individually represent integers from 0 to 2.

5 Claims, No Drawings

OTHER PUBLICATIONS

U.S. Appl. No. 11/596,188, filed Nov. 13, 2006, Akiyama et al.
U.S. Appl. No. 11/432,345, filed May 12, 2006, Shiota.
U.S. Appl. No. 11/484,604, filed Jul. 12, 2006, Nakagawa et al.
U.S. Appl. No. 11/486,085, filed Jul. 14, 2006, Nakagawa et al.
U.S. Appl. No. 11/489,468, filed Jul. 20, 2006, Akiyama et al.
U.S. Appl. No. 11/580,959, filed Oct. 16, 2006, Akiyama et al.
U.S. Appl. No. 12/093,254, filed May 9, 2008, Nakagawa et al.
U.S. Appl. No. 12/278,224, filed Aug. 4, 2008, Nakagawa et al.

* cited by examiner

METHOD FOR PRODUCING POLYMER, POLYMER, COMPOSITION FOR FORMING INSULATING FILM, METHOD FOR PRODUCING INSULATING FILM, AND INSULATING FILM

CROSS REFERENCE TO RELATED APPLICATION

This application is a continuation of International Patent Application No. PCT/JP2005/000373, having an international filing date of Jan. 14, 2005, which designated the United States, the entirety of which is incorporated herein by reference. Japanese Patent Application No. 2004-009205, filed on Jan. 16, 2004, is also incorporated herein by reference in its entirety.

BACKGROUND OF THE INVENTION

The present invention relates to a method for producing a polymer, a polymer, an insulating-film-forming composition, a method for producing an insulating film, and an insulating film.

A silica ($SiO_2$) film formed by a vacuum process such as chemical vapor deposition (CVD) has been widely used as an interlayer dielectric for semiconductor devices or the like. In recent years, a coating-type insulating film called a spin-on-glass (SOG) film which contains a tetraalkoxysilane hydrolysate as the major component has also been used in order to form a more uniform interlayer dielectric. Along with an increase in the degree of integration of semiconductor devices, a low-relative-dielectric-constant interlayer dielectric called an organic SOG which contains a polyorganosiloxane as the major component has been developed.

In particular, an improved electrical insulation between conductors has been demanded accompanying a further increase in the degree of integration and the number of layers of semiconductor devices. Therefore, an interlayer dielectric material has been demanded which exhibits a lower relative dielectric constant and excellent crack resistance, mechanical strength, and adhesion.

A composition containing fine particles obtained by condensing an alkoxysilane in the presence of ammonia and a basic partial hydrolysate of an alkoxysilane (JP-A-5-263045 and JP-A-5-315319), and a coating liquid obtained by condensing a basic hydrolysate of a polyalkoxysilane in the presence of ammonia (JP-A-11-340219 and JP-A-11-340220) have been proposed as low-relative-dielectric-constant materials. However, the material obtained by the above method is not suitable for production on an industrial scale, since the reaction product exhibits unstable properties and the resulting coating varies to a large extent in relative dielectric constant, crack resistance, mechanical strength, adhesion, and the like. A method of forming a low-dielectric-constant insulating film using a coating liquid prepared by mixing a polycarbosilane solution and a polysiloxane solution has also been proposed (JP-A-2001-127152). However, this method has a problem in which the carbosilane and the siloxane having nonuniform domains are dispersed in the coating.

A method has also been proposed which uses an organic silicate polymer obtained by preparing a carbon-bridge-containing silane oligomer from an organometallic silane compound and hydrolyzing and condensing the carbon-bridge-containing silane oligomer (WO2002-098955). However, the material obtained by this method cannot be stored for a long time due to the poor stability of the reaction product. Moreover, this material exhibits poor adhesion to a substrate.

SUMMARY

An object of the invention is to provide a method for producing a polymer and a polymer capable of forming a film which is suitably used as an interlayer dielectric for semiconductor devices or the like and exhibits a low relative dielectric constant, excellent mechanical strength and adhesion, and uniform quality.

Another object of the invention is to provide an insulating-film-forming composition using the polymer according to the invention, a method for producing an insulating film, and an insulating film.

A method of producing a polymer according to one aspect of the invention comprises hydrolyzing and condensing a hydrolyzable-group-containing silane monomer (B) in the presence of one or more polycarbosilanes (A), at least one of the polycarbosilanes (A) being a polycarbosilane (I) having a weight average molecular weight of 500 or more and obtained by reacting a compound of the following general formula (1) in the presence of at least one of an alkali metal and an alkaline earth metal,

$$R^1_m Y_{3-m} SiCR^2_n X_{3-n} \qquad (1)$$

wherein $R^1$ and $R^2$ individually represent a monovalent organic group or a hydrogen atom, X represents a halogen atom, Y represents a halogen atom or an alkoxy group, and m and n individually represent integers from 0 to 2.

In this method of producing a polymer, another polycarbosilane of the polycarbosilanes (A) may be a polycarbosilane (II) obtained by reacting the polycarbosilane (I) with an alcohol or an organic acid in an organic solvent.

In this method of producing a polymer, still another polycarbosilane of the polycarbosilanes (A) may be a polycarbosilane (III) obtained by reacting at least one of the polycarbosilane (I) and the polycarbosilane (II) with a reducing agent in an organic solvent.

In this method of producing a polymer, the hydrolyzable-group-containing silane monomer (B) may be at least one silane compound selected from the group consisting of a compound of the following general formula (2),

$$R^3_a SiX_{4-a} \qquad (2)$$

wherein $R^3$ represents a hydrogen atom, a fluorine atom, or a monovalent organic group, X represents a halogen atom or an alkoxy group, and a represents an integer from 0 to 3, and a compound of the following general formula (3),

$$R^4_b Y_{3-b} Si\text{—}(R^6)_d\text{—}SiZ_{3-c}R^5_c \qquad (3)$$

wherein $R^4$ and $R^5$ individually represent monovalent organic groups, b and c individually represent integers from 0 to 2, $R^6$ represents an oxygen atom, a phenylene group, or a group —$(CH_2)_e$— (wherein e represents an integer from 1 to 6), Y and Z individually represent a halogen atom or an alkoxy group, and d represents 0 or 1.

A polymer according to one aspect of the invention is obtained by the above-described method of producing a polymer.

An insulating-film-forming composition according to one aspect of the invention comprises the above-described polymer and an organic solvent.

A method of producing a polymer film according to one aspect of the invention comprises applying the above-described insulating-film-forming composition to a substrate, and heating the applied composition at 30 to 450° C.

A silica-based polymer film according to one aspect of the invention is obtained by the above-described method of producing a polymer film.

According to the above-described method of producing a polymer, a polymer in which the polysiloxane produced from the hydrolyzable-group-containing silane monomer (B) is reacted with the polycarbosilane (A) can be obtained by reacting the hydrolyzable-group-containing silane monomer (B) in the presence of the polycarbosilane (A). For example, a partially cocondensed polymer may be obtained by hydrolyzing and condensing the hydrolyzable-group-containing polymer (B) in the presence of the polycarbosilane (A). A polymer film which exhibits a low relative dielectric constant and excellent mechanical strength and adhesion and does not undergo phase separation can be obtained by using an insulating-film-forming composition including such a specific polymer.

DETAILED DESCRIPTION OF THE EMBODIMENT

Some embodiments of the invention will be described below in more detail.

1. Polymer

The polymer according to one embodiment of the invention is obtained by hydrolyzing and condensing the hydrolyzable-group-containing silane monomer (B) in the presence of one or more polycarbosilanes (A).

1.1. Polycarbosilane (A)

In the polymer, at least one of the polycarbosilanes (A) is the following polycarbosilane (I).

The polycarbosilane (I) having a weight average molecular weight of 500 or more and obtained by reacting a compound of the following general formula (1) in the presence of at least one of an alkali metal and an alkaline earth metal,

$$R^1_m Y_{3-m} SiCR^2_n X_{3-n} \quad (1)$$

wherein $R^1$ and $R^2$ individually represent a monovalent organic group or a hydrogen atom, X represents a halogen atom, Y represents a halogen atom or an alkoxy group, and m and n individually represent integers from 0 to 2.

The term "hydrolyzable group" used herein refers to a group which may be hydrolyzed during the production of the polymer in this embodiment. Specific examples of the hydrolyzable group include a hydrogen atom bonded to a silicon atom, a halogen atom, a hydroxyl group, alkoxy group, acyloxy group, sulfone group, methanesulfone group, and trifluoromethanesulfone group. Note that the hydrolyzable group is not limited thereto.

The polymer in this embodiment may be obtained using, as the polycarbosilane (A), a polycarbosilane (II) obtained by reacting the polycarbosilane (I) with an alcohol or an organic acid in an organic solvent.

The polymer in this embodiment may be obtained using, as the polycarbosilane (A), a polycarbosilane (III) obtained by reacting at least one of the polycarbosilane (I) and the polycarbosilane (II) with a reducing agent in an organic solvent.

1.1.1. Compound of general formula (1)(hereinafter also called "compound 1")

In the general formula (1), $R^1$ and $R^2$ individually represent a hydrogen atom or a monovalent organic group. As specific examples of $R^1$ and $R^2$, a linear or branched aliphatic group having 1 to 10 carbon atoms such as an alkyl group, alkenyl group, and alkynyl group; an alicyclic group having 3 to 20 carbon atoms such as a cycloalkyl group, cycloalkenyl group, and bicycloalkyl group; an aryl group having 6 to 20 carbon atoms; and an aralkyl group having 6 to 20 carbon atoms can be given.

Examples of the alkyl group include a methyl group, ethyl group, n-propyl group, isopropyl group, n-butyl group, isobutyl group, t-butyl group, n-pentyl group, isopentyl group, neopentyl group, hexyl group, and the like.

Examples of the alkenyl group include a vinyl group, propenyl group, 3-butenyl group, 3-pentenyl group, 3-hexenyl group, and the like.

Examples of the alkynyl group include a propargyl group, 3-methylpropargyl group, 3-ethylpropargyl group, and the like.

Examples of the cycloalkyl group include a cyclopropyl group, cyclobutyl group, cyclopentyl group, cyclohexyl group, norbornyl group, and the like.

Examples of the aryl group include a phenyl group, tolyl group, xylyl group, alpha-naphthyl group, beta-naphthyl group, alpha-thiophene group, beta-thiophene group, and the like.

Examples of the aralkyl group include a benzyl group, phenethyl group, phenylpropyl group, phenylbutyl group, and the like.

As examples of the halogen atom represented by X and Y, a fluorine atom, chlorine atom, bromine atom, and iodine atom can be given. As R of the alkoxy group (—OR) represented by Y, the alkyl group and the aryl group given as examples for $R^1$ and $R^2$ can be given.

Examples of the compound 1 include silicon compounds such as chloromethyltrichlorosilane, bromomethyltrichlorosilane, iodomethyltrichlorosilane, chloromethylmethyldichlorosilane, chloromethylethyldichlorosilane, chloromethyl-n-propyldichlorosilane, chloromethylisopropyldichlorosilane, chloromethyl-n-butyldichlorosilane, chloromethyl-t-butyldichlorosilane, chloromethylcyclohexyldichlorosilane, chloromethylphenethyldichlorosilane, chloromethylvinyldichlorosilane, chloromethylphenyldichlorosilane, bromomethylmethyldichlorosilane, bromomethylethyldichlorosilane, bromomethyl-n-propyldichlorosilane, bromomethylisopropyldichlorosilane, bromomethyl-n-butyldichlorosilane, bromomethyl-t-butyldichlorosilane, bromomethylcyclohexyldichlorosilane, bromomethylphenethyldichlorosilane, bromomethylvinyldichlorosilane, bromomethylphenyldichlorosilane, iodomethylmethyldichlorosilane, iodomethylethyldichlorosilane, iodomethyl-n-propyldichlorosilane, iodomethylisopropyldichlorosilane, iodomethyl-n-butyldichlorosilane, iodomethyl-t-butyldichlorosilane, iodomethylcyclohexyldichlorosilane, iodomethylphenethyldichlorosilane, iodomethylvinyldichlorosilane, iodomethylphenyldichlorosilane, chloromethyldimethylchlorosilane, chloromethyldiethylchlorosilane, chloromethyldi-n-propylchlorosilane, chloromethyldiisopropylchlorosilane, chloromethyl-n-dibutylchlorosilane, chloromethyldi-t-butylchlorosilane, chloromethyldicyclohexylchlorosilane, chloromethyldiphenethylchlorosilane, chloromethyldivinylchlorosilane, chloromethyldiphenylchlorosilane, bromomethyldimethylchlorosilane, bromomethyldiethylchlorosilane, bromomethyldi-n-propylchlorosilane, bromomethyldiisopropylchlorosilane, bromomethyldi-n-butylchlorosilane, bromomethyldi-t-butylchlorosilane, bromomethyldicyclohexylchlorosilane, bromomethyldiphenethylchlorosilane, bromomethyldivinylchlorosilane, bromomethyldiphenylchlorosilane, iodomethyldimethylchlorosilane, iodomethyldiethylchlorosilane, iodomethyldi-n-propylchlorosilane, iodomethyldiisopropylchlorosilane, iodomethyldi-n-butylchlorosilane, iodomethyldi-t-butylchlorosilane, iodomethyldicyclohexylchlorosilane, iodomethyldiphenethylchlorosilane, iodomethyldivinylchlorosilane, iodomethyldiphenylchlorosilane, (1-chloroethyl)trichlorosilane, (1-chloropropyl)trichlorosilane, (2-chloro-2-propyl)trichlorosilane, (1-chlorobutyl)trichlorosilane, (2-chloro-2-butyl)trichlorosilane, (3-chloro-3-pentyl)trichlorosilane, (1-chloro-2-propenyl)trichlorosilane, (alpha-chlorobenzyl)trichlorosilane, dichloromethyltrichlorosilane, trichloromethyltrichlorosilane, (1-chloroethyl)methyldichlorosilane, (1-chloropropyl)methyldichlorosilane, (2-chloro-2-propyl)methyldichlorosilane, (1-chlorobutyl)methyldichlorosilane, (2-chloro-2-butyl)methyldichlorosilane, (3-chloro-3-pentyl)methyldichlorosilane, (1-chloro-2-propenyl)methyldichlorosilane, (alpha-chlorobenzyl)methyldichlorosilane, dichloromethylmethyldichlorosilane, trichloromethylmethyldichlorosilane, (1-chloroethyl)dimethylchlorosilane, (1-chloropropyl)dimethylchlorosilane, (2-chloro-2-propyl)dimethylchlorosilane, (1-chlorobutyl)dimethylchlorosilane, (2-chloro-2-butyl)dimethylchlorosilane, (3-chloro-3-pentyl)dimethylchlorosilane, (1-chloro-2-propenyl)dimethylchlorosilane, (alpha-chlorobenzyl)dimethylchlorosilane, dichloromethyldimethylchlorosilane, trichloromethyldimethylchlorosilane, chloromethyltrimethoxysilane, bromomethyltrimethoxysilane, iodomethyltrimethoxysilane, chloromethylmethyldimethoxysilane, chloromethylethyldimethoxysilane, chloromethyl-n-propyldimethoxysilane, chloromethylisopropyldimethoxysilane, chloromethyl-n-butyldimethoxysilane, chloromethyl-t-butyldimethoxysilane, chloromethylcyclohexyldimethoxysilane, chloromethylphenethyldimethoxysilane, chloromethylvinyldimethoxysilane, chloromethylphenyldimethoxysilane, bromomethylmethyldimethoxysilane, bromomethylethyldimethoxysilane, bromomethyl-n-propyldimethoxysilane, bromomethylisopropyldimethoxysilane, bromomethyl-n-butyldimethoxysilane, bromomethyl-t-butyldimethoxysilane, bromomethylcyclohexyldimethoxysilane, bromomethylphenethyldimethoxysilane, bromomethylvinyldimethoxysilane, bromomethylphenyldimethoxysilane, iodomethylmethyldimethoxysilane, iodomethylethyldimethoxysilane, iodomethyl-n-propyldimethoxysilane, iodomethylisopropyldimethoxysilane, iodomethyl-n-butyldimethoxysilane, iodomethyl-t-butyldimethoxysilane, iodomethylcyclohexyldimethoxysilane, iodomethylphenethyldimethoxysilane, iodomethylvinyldimethoxysilane, iodomethylphenyldimethoxysilane, chloromethyldimethylmethoxysilane, chloromethyldiethylmethoxysilane, chloromethyldi-n-propylmethoxysilane, chloromethyldiisopropylmethoxysilane, chloromethyl-n-dibutylmethoxysilane, chloromethyldi-t-butylmethoxysilane, chloromethyldicyclohexylmethoxysilane, chloromethyldiphenethylmethoxysilane, chloromethyldivinylmethoxysilane, chloromethyldiphenylmethoxysilane, bromomethyldimethylmethoxysilane, bromomethyldiethylmethoxysilane, bromomethyldi-n-propylmethoxysilane, bromomethyldiisopropylmethoxysilane, bromomethyldi-n-butylmethoxysilane, bromomethyldi-t-butylmethoxysilane, bromomethyldicyclohexylmethoxysilane, bromomethyldiphenethylmethoxysilane, bromomethyldivinylmethoxysilane, bromomethyldiphenylmethoxysilane, iodomethyldimethylmethoxysilane, iodomethyldiethylmethoxysilane, iodomethyldi-n-propylmethoxysilane, iodomethyldiisopropylmethoxysilane, iodomethyldi-n-butylmethoxysilane, iodomethyldi-t-butylmethoxysilane, iodomethyldicyclohexylmethoxysilane, iodomethyldiphenethylmethoxysilane, iodomethyldivinylmethoxysilane, iodomethyldiphenylmethoxysilane, chloromethyltriethoxysilane, bromomethyltriethoxysilane, iodomethyltriethoxysilane, chloromethylmethyldiethoxysilane, chloromethylethyldiethoxysilane, chloromethyl-n-propyldiethoxysilane, chloromethylisopropyldiethoxysilane, chloromethyl-n-butyldiethoxysilane, chloromethyl-t-butyldiethoxysilane, chloromethylcyclohexyldiethoxysilane, chloromethylphenethyldiethoxysilane, chloromethylvinyldiethoxysilane, chloromethylphenyldiethoxysilane, bromomethylmethyldiethoxysilane, bromomethylethyldiethoxysilane, bromomethyl-n-propyldiethoxysilane, bromomethylisopropyldiethoxysilane, bromomethyl-n-butyldiethoxysilane, bromomethyl-t-butyldiethoxysilane, bromomethylcyclohexyldiethoxysilane, bromomethylphenethyldiethoxysilane, bromomethylvinyldiethoxysilane, bromomethylphenyldiethoxysilane, iodomethylmethyldiethoxysilane, iodomethylethyldiethoxysilane, iodomethyl-n-propyldiethoxysilane, iodomethylisopropyldiethoxysilane, iodomethyl-n-butyldiethoxysilane, iodomethyl-t-butyldiethoxysilane, iodomethylcyclohexyldiethoxysilane, iodomethylphenethyldiethoxysilane, iodomethylvinyldiethoxysilane, iodomethylphenyldiethoxysilane, chloromethyldimethylethoxysilane, chloromethyldiethylethoxysilane, chloromethyldi-n-propylethoxysilane, chloromethyldiisopropylethoxysilane, chloromethyl-n-dibutylethoxysilane, chloromethyldi-t-butylethoxysilane, chloromethyldicyclohexylethoxysilane, chloromethyldiphenethylethoxysilane, chloromethyldivinylethoxysilane, chloromethyldiphenylethoxysilane, bromomethyldimethylethoxysilane, bromomethyldiethylethoxysilane, bromomethyldi-n-propylethoxysilane, bromomethyldiisopropylethoxysilane, bromomethyldi-n-butylethoxysilane, bromomethyldi-t-butylethoxysilane, bromomethyldicyclohexylethoxysilane, bromomethyldiphenethylethoxysilane, bromomethyldivinylethoxysilane, bromomethyldiphenylethoxysilane, iodomethyldimethylethoxysilane, iodomethyldiethylethoxysilane, iodomethyldi-n-propylethoxysilane, iodomethyldiisopropylethoxysilane, iodomethyldi-n-butylethoxysilane, iodomethyldi-t-butylethoxysilane, iodomethyldicyclohexylethoxysilane, iodomethyldiphenethylethoxysilane, iodomethyldivinylethoxysilane, iodomethyldiphenylethoxysilane, chloromethyltri-n-propoxysilane, bromomethyltri-n-propoxysilane, iodomethyltri-n-propoxysilane, chloromethylmethyldi-n-propoxysilane, chloromethylethyldi-n-propoxysilane, chloromethyl-n-propyldi-n-propoxysilane, chloromethylisopropyldi-n-propoxysilane, chloromethyl-n-butyldi-n-propoxysilane, chloromethyl-t-butyldi-n-propoxysilane, chloromethylcyclohexyldi-n-propoxysilane, chloromethylphenethyldi-n-propoxysilane, chloromethylvinyldi-n-propoxysilane, chloromethylphenyldi-n-propoxysilane, bromomethylmethyldi-n-propoxysilane, bromomethylethyldi-n-propoxysilane, bromomethyl-n-propyldi-n-propoxysilane, bromomethylisopropyldi-n-propoxysilane, bromomethyl-n-butyldi-n-propoxysilane, bromomethyl-t-butyldi-n-propoxysilane, bromomethylcyclohexyldi-n-propoxysilane, bromomethylphenethyldi-n-propoxysilane, bromomethylvinyldi-n-propoxysilane, bromomethylphenyldi-n-propoxysilane, iodomethylmethyldi-n-propoxysilane, iodomethylethyldi-n-propoxysilane, iodomethyl-n-propyldi-n-propoxysilane, iodomethylisopropyldi-n-propoxysilane, iodomethyl-n-butyldi-n-propoxysilane, iodomethyl-t-butyldi-n-propoxysilane, iodomethylcyclohexyldi-n-propoxysilane, iodomethylphenethyldi-n-propoxysilane, iodomethylvinyldi-n-propoxysilane, iodomethylphenyldi-n-propoxysilane, chloromethyldimethyl-n-propoxysilane, chloromethyldiethyl-n-propoxysilane, chloromethyldi-n-propyl-n-propoxysilane, chloromethyldiisopropyl-n-propoxysilane, chloromethyl-n-dibutyl-n-propoxysilane, chloromethyldi-t-butyl-n-propoxysilane, chloromethyldicyclohexyl-n-propoxysilane, chloromethyldiphenethyl-n-propoxysilane, chloromethyldivinyl-n-propoxysilane, chloromethyldiphenyl-n-propoxysilane, bromomethyldimethyl-n-propoxysilane, bromomethyldiethyl-n-propoxysilane, bromomethyldi-n-propyl-n-propoxysilane, bromomethyldiisopropyl-n-propoxysilane, bromomethyldi-n-butyl-n-propoxysilane, bromomethyldi-t-butyl-n-propoxysilane, bromomethyldicyclohexyl-n-propoxysilane, bromomethyldiphenethyl-n-propoxysilane, bromomethyldivinyl-n-propoxysilane, bromomethyldiphenyl-n-propoxysilane, iodomethyldimethyl-n-propoxysilane, iodomethyldiethyl-n-propoxysilane, iodomethyldi-n-propyl-n-propoxysilane, iodomethyldiisopropyl-n-propoxysilane, iodomethyldi-n-butyl-n-propoxysilane, iodomethyldi-t-butyl-n-propoxysilane, iodomethyldicyclohexyl-n-propoxysilane, iodomethyldiphenethyl-n-propoxysilane, iodomethyldivinyl-n-propoxysilane, iodomethyldiphenyl-n-propoxysilane, chloromethyltriisopropoxysilane, bromomethyltriisopropoxysilane, iodomethyltriisopropoxysilane, chloromethylmethyldiisopropoxysilane, chloromethylethyldiisopropoxysilane, chloromethyl-n-propyldiisopropoxysilane, chloromethylisopropyldiisopropoxysilane, chloromethyl-n-butyldiisopropoxysilane, chloromethyl-t-butyldiisopropoxysilane, chloromethylcyclohexyldiisopropoxysilane, chloromethylphenethyldiisopropoxysilane, chloromethylvinyldiisopropoxysilane, chloromethylphenyldiisopropoxysilane, bromomethylmethyldiisopropoxysilane, bromomethylethyldiisopropoxysilane, bromomethyl-n-propyldiisopropoxysilane, bromomethylisopropyldiisopropoxysilane, bromomethyl-n-butyldiisopropoxysilane, bromomethyl-t-butyldiisopropoxysilane, bromomethylcyclohexyldiisopropoxysilane, bromomethylphenethyldiisopropoxysilane, bromomethylvinyldiisopropoxysilane, bromomethylphenyldiisopropoxysilane, iodomethylmethyldiisopropoxysilane, iodomethylethyldiisopropoxysilane, iodomethyl-n-propyldiisopropoxysilane, iodomethylisopropyldiisopropoxysilane, iodomethyl-n-butyldiisopropoxysilane, iodomethyl-t-butyldiisopropoxysilane, iodomethylcyclohexyldiisopropoxysilane, iodomethylphenethyldiisopropoxysilane, iodomethylvinyldiisopropoxysilane, iodomethylphenyldiisopropoxysilane, chloromethyldimethylisopropoxysilane, chloromethyldiethylisopropoxysilane, chloromethyldi-n-propylisopropoxysilane, chloromethyldiisopropylisopropoxysilane, chloromethyl-n-dibutylisopropoxysilane, chloromethyldi-t-butylisopropoxysilane, chloromethyldicyclohexylisopropoxysilane, chloromethyldiphenethylisopropoxysilane, chloromethyldivinylisopropoxysilane, chloromethyldiphenylisopropoxysilane, bromomethyldimethylisopropoxysilane, bromomethyldiethylisopropoxysilane, bromomethyldi-n-propylisopropoxysilane, bromomethyldiisopropylisopropoxysilane, bromomethyldi-n-butylisopropoxysilane, bromomethyldi-t-butylisopropoxysilane, bromomethyldicyclohexylisopropoxysilane, bromomethyldiphenethylisopropoxysilane, bromomethyldivinylisopropoxysilane, bromomethyldiphenylisopropoxysilane, iodomethyldimethylisopropoxysilane, iodomethyldiethylisopropoxysilane, iodomethyldi-n-propylisopropoxysilane, iodomethyldiisopropylisopropoxysilane, iodomethyldi-n-butylisopropoxysilane, iodomethyldi-t-butylisopropoxysilane, iodomethyldicyclohexylisopropoxysilane, iodomethyldiphenethylisopropoxysilane, iodomethyldivinylisopropoxysilane, and iodomethyldiphenylisopropoxysilane.

Of these, chloromethyltrichlorosilane, bromomethyltrichlorosilane, chloromethylmethyldichlorosilane, chloromethylethyldichlorosilane, chloromethylvinyldichlorosilane, chloromethylphenyldichlorosilane, bromomethylmethyldichlorosilane, bromomethylvinyldichlorosilane, chloromethyldimethylchlorosilane, chloromethyldivinylchlorosilane, bromomethyldimethylchlorosilane, (1-chloroethyl)trichlorosilane, (1-chloropropyl)trichlorosilane, chloromethyltrimethoxysilane, bromomethyltrimethoxysilane, chloromethylmethyldimethoxysilane, chloromethylvinyldimethoxysilane, chloromethylphenyldimethoxysilane, bromomethylmethyldimethoxysilane, bromomethylvinyldimethoxysilane, bromomethylphenyldimethoxysilane, chloromethyldimethylmethoxysilane, chloromethyldivinylmethoxysilane, chloromethyldiphenylmethoxysilane, bromomethyldimethylmethoxysilane, bromomethyldiisopropylmethoxysilane, chloromethyltriethoxysilane, bromomethyltriethoxysilane, chloromethylmethyldiethoxysilane, chloromethylethyldiethoxysilane, chloromethylvinyldiethoxysilane, chloromethylphenyldiethoxysilane, bromomethylmethyldiethoxysilane, bromomethylvinyldiethoxysilane, bromomethylphenyldiethoxysilane, chloromethyldimethylethoxysilane, chloromethyldiethylethoxysilane, bromomethyldivinylethoxysilane, chloromethyltriisopropoxysilane, bromomethyltriisopropoxysilane, and the like are preferable.

The compound 1 may be used either individually or in combination of two or more.

1.2. Production of Polycarbosilane

The polycarbosilane (I) may be obtained by reacting the compound 1 in the presence of at least one of an alkali metal and an alkaline earth metal as described in "1. Polymer".

As the alkali metal which may be used in this embodiment, lithium, potassium, and sodium can be given. As the alkaline earth metal which may be used in this embodiment, magnesium can be given. In this embodiment, it is preferable to use magnesium.

The alkali metal and the alkaline earth metal are used to reductively eliminate the halogen atom or the alkoxy group from the compound to form a halogenated metal. The alkali metal and the alkaline earth metal are preferably used in an amount equivalent to the total amount of carbon-halogen bond and carbon-alkoxy group bond of the compound 1.

In the method of producing a polymer according to one embodiment of the invention, another polycarbosilane of the polycarbosilanes (A) may be a polycarbosilane (II) obtained by reacting the polycarbosilane (I) with an alcohol or an organic acid in an organic solvent.

In the method of producing a polymer, still another polycarbosilane of the polycarbosilanes (A) may be a polycarbosilane (III) obtained by reacting at least one of the polycarbosilane (I) and the polycarbosilane (II) with a reducing agent in an organic solvent.

In the methods of producing the polycarbosilanes (I) to (III), ultrasonic waves may be applied to the reaction solution from the outside to promote the reaction, as required. The frequency of the ultrasonic waves used to promote the reaction is preferably about 10 to 70 kHz.

As the solvent used in the production of the polycarbosilanes (I) to (III), an ether solvent may be preferably used.

When using a hydrocarbon solvent generally used for a Kipping reaction, the yield of the objective soluble silicon oligomer tends to be decreased.

Examples of the ether solvent include diethyl ether, di-n-propyl ether, diisopropyl ether, dibutyl ether, ethyl propyl ether, anisole, phenetole, diphenyl ether, diethylene glycol dimethyl ether, diethylene glycol diethyl ether, diethylene glycol dibutyl ether, diethylene glycol methyl ethyl ether, dipropylene glycol dimethyl ether, dipropylene glycol diethyl ether, dipropylene glycol dibutyl ether, dipropylene glycol methyl ethyl ether, ethylene glycol dimethyl ether, ethylene glycol diethyl ether, ethylene glycol dibutyl ether, ethylene glycol methyl ethyl ether, propylene glycol dimethyl ether, propylene glycol diethyl ether, propylene glycol dibutyl ether, propylene glycol methyl ethyl ether, tetrahydrofuran, dioxane, and the like. Of these ether solvents, diethyl ether, tetrahydrofuran, ethylene glycol dimethyl ether, ethylene glycol diethyl ether, and the like are preferable in view of the solubility of the resulting polymer.

It is preferable to remove water from the ether solvent in advance. For example, water is preferably removed from the ether solvent by degassing/distillation in the presence of sodium-benzophenone ketyl. The amount of the solvent to be used is not particularly limited. The solvent is used in an amount of preferably 1 to 30 parts by weight, and still more preferably 2 to 20 parts by weight for the total amount of the compound 1.

The reaction temperature when producing the polycarbosilane (I) is preferably 30 to 150° C., and still more preferably 30 to 100° C. If the reaction temperature is lower than 30° C., productivity may be insufficient due to a low reaction rate. If the reaction temperature is higher than 150° C., the reaction becomes complicated, whereby the solubility of the resulting polymer tends to be decreased. The reaction is preferably carried out in an inert gas such as argon or nitrogen.

In the method of producing the polycarbosilane (II), a halogen atom can be replaced with a stable alkoxy group or ester group by reacting the polycarbosilane (I) containing an unreacted hydrolyzable halogen atom at the molecular terminal or in the side chain with an alcohol or an organic acid.

Examples of the alcohol include monohydric alcohols such as methanol, ethanol, n-propanol, i-propanol, n-butanol, i-butanol, sec-butanol, t-butanol, n-pentanol, i-pentanol, 2-methylbutanol, sec-pentanol, t-pentanol, 3-methoxybutanol, n-hexanol, 2-methylpentanol, sec-hexanol, 2-ethylbutanol, sec-heptanol, 3-heptanol, n-octanol, 2-ethylhexanol, sec-octanol, n-nonyl alcohol, 2,6-dimethyl-4-heptanol, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, and diacetone alcohol; polyhydric alcohols such as ethylene glycol, 1,2-polyethylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, and tripropylene glycol; polyhydric alcohol partial ethers such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethylbutyl ether, diethylene glycol monomethyl ether, diethylene glycol monoethyl ether, diethylene glycol monopropyl ether, diethylene glycol monobutyl ether, diethylene glycol monohexyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, dipropylene glycol monopropyl ether; and the like.

Examples of the organic acid include acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, shikimic acid, 2-ethylhexanoic acid, oleic acid, stearic acid, linolic acid, linoleic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid, tartaric acid, succinic acid, fumaric acid, itaconic acid, mesaconic acid, citraconic acid, malic acid, glutaric acid, and the like.

The alcohol or the acid may be used either individually or in combination of two or more.

The alcohol or the acid is used so that the amount of hydroxyl groups contained in the alcohol or the acid is at least 1.0 equivalent, and preferably 1.0 to 4.0 equivalents for 1.0 equivalent of residual halogen atoms contained in the polymer. The solvent used is not particularly limited insofar as the solvent does not react with the alcohol or the acid used. The solvent is preferably an aromatic solvent such as benzene, toluene-xylene, or mesitylene. The solvent may be used either individually or in combination of two or more. In order to capture a hydrogen halide produced during the above reaction, it is preferable to add an organic amine which makes a pair with the hydrogen halide to generate a salt and does not contain active hydrogen. As specific examples of the organic amine, pyridine, pyrrole, picoline, diazabicyclooctane, diazabicyclononane, diazabicycloundecene, trimethylamine, triethylamine, tripropylamine, tributylamine, and the like can be given. These alkali catalysts may be used either individually or in combination of two or more.

In the method of producing the polycarbosilane (III), a substituent on a silicon atom can be replaced with a stable hydrogen atom by reducing at least one of the polycarbosilane (I) containing an unreacted hydrolyzable halogen atom at the molecular terminal and the alkoxylated or esterified polycarbosilane (II) using a reducing agent.

As examples of the reducing agent, $LiAlH_4$, $NaH$, $LiBu_3BH$, $(C_5H_{11})_2BH$, $B_2H_6$, $NaBH_4$, $Zn(BH_4)_2$, $NaBH_3CN$, $Bu_2AlH$, $Li(OBu)_3AlH$, and the like can be given. Of these, $LiAlH_4$, $NaH$, $B_2H_6$, and $NaBH_4$ are preferable.

The reducing agent is used so that the amount of hydrogen atoms contained in the reducing agent is at least 1.0 equivalent, and preferably 1.0 to 4.0 equivalents for 1.0 equivalent of halogen atoms contained in the polymer. The solvent used is not particularly limited insofar as the solvent does not react with the reducing agent. The solvent is preferably an ether solvent. The ether solvent given above may be used. The solvent may be used either individually or in combination of two or more.

The reaction temperature is preferably −78 to 60° C. If the reaction temperature is lower than −78° C., productivity may be insufficient due to a low reaction rate. If the reaction temperature is higher than 60° C., the solubility of the reaction product may be decreased, whereby the yield of the polymer may be decreased. The reaction is preferably carried out in an inert gas such as argon or nitrogen.

The weight average molecular weight of the polycarbosilane (I) used in this embodiment is usually 500 or more, preferably 700 or more, and still more preferably 500 to 30,000. If the weight average molecular weight is less than 500, gelation may occur due to rapid polymerization of the polycarbosilane (I) during hydrolysis and condensation, or a low-molecular-weight compound having high crystallinity may be formed.

1.3. Production of Polymer

In the method of producing a polymer, the polymer may be obtained by hydrolyzing and condensing, as the hydrolyzable-group-containing silane monomer (B), at least one silane compound selected from the group consisting of a compound of the following general formula (2) and a compound of the following general formula (3) in the presence of the polycarbosilane (A) described in "1. Polymer" in an organic solvent in the presence of a catalyst,

$$R^3{}_a SiX_{4-a} \quad (2)$$

wherein $R^3$ represents a hydrogen atom, a fluorine atom, or a monovalent organic group, X represents a halogen atom or an alkoxy group, and a represents an integer from 0 to 3,

$$R^4{}_b Y_{3-b} Si-(R^6)_d-SiZ_{3-c}R^5{}_c \quad (3)$$

wherein $R^4$ and $R^5$ individually represent monovalent organic groups, b and c individually represent integers from 0 to 2, $R^6$ represents an oxygen atom, a phenylene group, or a group —$(CH_2)_e$— (wherein e represents an integer from 1 to 6), Y and Z individually represent a halogen atom or an alkoxy group, and d represents 0 or 1.

1.3.1. Compound of General Formula (2) (Hereinafter Also Called "Compound 2")

In the general formula (2), $R^3$ represents a hydrogen atom, a fluorine atom, or a monovalent organic group. As examples of the monovalent organic group, an alkyl group, aryl group, allyl group, glycidyl group, vinyl group, and the like can be given. In the general formula (2), $R^3$ preferably represents a monovalent organic group, and particularly preferably an alkyl group or a phenyl group.

As examples of the alkyl group, a methyl group, ethyl group, propyl group, butyl group, and the like can be given. The alkyl group preferably has 1 to 5 carbon atoms. These alkyl groups may be either linear or branched, in which a hydrogen atom may be replaced with a fluorine atom, an amino group, or the like.

As examples of the aryl group, a phenyl group, naphthyl group, methylphenyl group, ethylphenyl group, chlorophenyl group, bromophenyl group, fluorophenyl group, and the like can be given.

As the hydrocarbon portion of the alkoxy group represented by X, the groups given as examples of the monovalent organic group represented by $R^3$ may be applied.

Examples of the compound of the general formula (2) (hereinafter called "compound 2") include silicon compounds such as tetramethoxysilane, tetraethoxysilane, tetra-n-propoxysilane, tetra-iso-propoxysilane, tetra-n-butoxysilane, tetra-sec-butoxysilane, tetra-tert-butoxysilane, tetraphenoxysilane, trimethoxysilane, triethoxysilane, tri-n-propoxysilane, tri-iso-propoxysilane, tri-n-butoxysilane, tri-sec-butoxysilane, tri-t-butoxysilane, triphenoxysilane, fluorotrimethoxysilane, fluorotriethoxysilane, fluorotri-n-propoxysilane, fluorotri-iso-propoxysilane, fluorotri-n-butoxysilane, fluorotri-sec-butoxysilane, fluorotri-tert-butoxysilane, fluorotriphenoxysilane, methyltrimethoxysilane, methyltriethoxysilane, methyltri-n-propoxysilane, methyltri-iso-propoxysilane, methyltri-n-butoxysilane, methyltri-sec-butoxysilane, methyltri-tert-butoxysilane, methyltriphenoxysilane, ethyltrimethoxysilane, ethyltriethoxysilane, ethyltri-n-propoxysilane, ethyltri-iso-propoxysilane, ethyltri-n-butoxysilane, ethyltri-sec-butoxysilane, ethyltri-tert-butoxysilane, ethyltriphenoxysilane, vinyltrimethoxysilane, vinyltriethoxysilane, vinyltri-n-propoxysilane, vinyltri-iso-propoxysilane, vinyltri-n-butoxysilane, vinyltri-sec-butoxysilane, vinyltri-tert-butoxysilane, vinyltriphenoxysilane, n-propyltrimethoxysilane, n-propyltriethoxysilane, n-propyltri-n-propoxysilane, n-propyltri-iso-propoxysilane, n-propyltri-n-butoxysilane, n-propyltri-sec-butoxysilane, n-propyltri-tert-butoxysilane, n-propyltriphenoxysilane, i-propyltrimethoxysilane, i-propyltriethoxysilane, i-propyltri-n-propoxysilane, i-propyltri-iso-propoxysilane, i-propyltri-n-butoxysilane, i-propyltri-sec-butoxysilane, i-propyltri-tert-butoxysilane, i-propyltriphenoxysilane, n-butyltrimethoxysilane, n-butyltriethoxysilane, n-butyltri-n-propoxysilane, n-butyltri-iso-propoxysilane, n-butyltri-n-butoxysilane, n-butyltri-sec-butoxysilane, n-butyltri-tert-butoxysilane, n-butyltriphenoxysilane, sec-butyltrimethoxysilane, sec-butyltriethoxysilane, sec-butyltri-n-propoxysilane, sec-butyltri-iso-propoxysilane, sec-butyltri-n-butoxysilane, sec-butyltri-sec-butoxysilane, sec-butyltri-tert-butoxysilane, sec-butyl-triphenoxysilane, t-butyltrimethoxysilane, t-butyltriethoxysilane, t-butyltri-n-propoxysilane, t-butyltri-iso-propoxysilane, t-butyltri-n-butoxysilane, t-butyltri-sec-butoxysilane, t-butyltri-tert-butoxysilane, t-butyltriphenoxysilane, phenyltrimethoxysilane, phenyltriethoxysilane, phenyltri-n-propoxysilane, phenyltri-iso-propoxysilane, phenyltri-n-butoxysilane, phenyltri-sec-butoxysilane, phenyltri-tert-butoxysilane, phenyltriphenoxysilane, vinyltrimethoxysilane, vinyltriethoxysilane, gamma-aminopropyltrimethoxysilane, gamma-aminopropyltriethoxysilane, gamma-glycidoxypropyltrimethoxysilane, gamma-glycidoxypropyltriethoxysilane, gamma-trifluoropropyltrimethoxysilane, gamma-trifluoropropyltriethoxysilane, dimethyldimethoxysilane, dimethyldiethoxysilane, dimethyl-di-n-propoxysilane, dimethyl-di-iso-propoxysilane, dimethyl-di-n-butoxysilane, dimethyl-di-sec-butoxysilane, dimethyl-di-tert-butoxysilane, dimethyldiphenoxysilane, diethyldimethoxysilane, diethyldiethoxysilane, diethyl-di-n-propoxysilane, diethyl-di-iso-propoxysilane, diethyl-di-n-butoxysilane, diethyl-di-sec-butoxysilane, diethyl-di-tert-butoxysilane, diethyl-di-phenoxysilane, di-n-propyldimethoxysilane, di-n-propyldiethoxysilane, di-n-propyl-di-n-propoxysilane, di-n-propyl-di-iso-propoxysilane, di-n-propyl-di-n-butoxysilane, di-n-propyl-di-sec-butoxysilane, di-n-propyl-di-tert-butoxysilane, di-n-propyl-di-phenoxysilane, di-iso-propyldimethoxysilane, di-iso-propyldiethoxysilane, di-iso-propyl-di-n-propoxysilane, di-iso-propyl-di-iso-propoxysilane, di-iso-propyl-di-n-butoxysilane, di-iso-propyl-di-sec-butoxysilane, di-iso-propyl-di-tert-butoxysilane, di-iso-propyl-di-phenoxysilane, di-n-butyldimethoxysilane, di-n-butyldiethoxysilane, di-n-butyl-di-n-propoxysilane, di-n-butyl-di-iso-propoxysilane, di-n-butyl-di-n-butoxysilane, di-n-butyl-di-sec-butoxysilane, di-n-butyl-di-tert-butoxysilane, di-n-butyl-di-phenoxysilane, di-sec-butyldimethoxysilane, di-sec-butyldiethoxysilane, di-sec-butyl-di-n-propoxysilane, di-sec-butyl-di-iso-propoxysilane, di-sec-butyl-di-n-butoxysilane, di-sec-butyl-di-sec-butoxysilane, di-sec-butyl-di-tert-butoxysilane, di-sec-butyl-di-phenoxysilane, di-tert-butyldimethoxysilane, di-tert-butyldiethoxysilane, di-tert-butyl-di-n-propoxysilane, di-tert-butyl-di-iso-propoxysilane, di-tert-butyl-di-n-butoxysilane, di-tert-butyl-di-sec-butoxysilane, di-tert-butyl-di-tert-butoxysilane, di-tert-butyl-di-phenoxysilane, diphenyldimethoxysilane, diphenyl-di-ethoxysilane, diphenyl-di-n-propoxysilane, diphenyl-di-iso-propoxysilane, diphenyl-di-n-butoxysilane, diphenyl-di-sec-butoxysilane, diphenyl-di-tert-butoxysilane, diphenyldiphenoxysilane, divinyltrimethoxysilane, tetrachlorosilane, tetrabromosilane, tetraiodosilane, trichlorosilane, tribromosilane, triiodosilane, methyltrichlorosilane, ethyltrichlorosilane, n-propyltrichlorosilane, isopropyltrichlorosilane, n-butyltrichlorosilane, t-butyltrichlorosilane, cyclohexyltrichlorosilane, phenethyltrichlorosilane, 2-norbornyltrichlorosilane, vinyltrichlorosilane, phenyltrichlorosilane, methyltribromosilane, ethyltribromosilane, n-propyltribromosilane, isopropyltribromosilane, n-butyltribromosilane, t-butyltribromosilane, cyclohexyltribromosilane, phenethyltribromosilane, 2-norbornyltribromosilane, vinyltribromosilane, phenyltribromosilane, methyltriiodosilane, ethyltriiodosilane, n-propyltriiodosilane, isopropyltriiodosilane, n-butyltriiodosilane, t-butyltriiodosilane, cyclohexyltriiodosilane, phenethyltriiodosilane, 2-norbornyltriiodosilane, vinyltriiodosilane, phenyltriiodosilane, dimethyldichlorosilane, diethyldichlorosilane, di-n-propyldichlorosilane, diisopropyldichlorosilane, di-n-butyldichlorosilane, di-t-butyldichlorosilane, dicyclohexyldichlorosilane, diphenethyldichlorosilane, di-2-norbornyldichlorosilane, divinyldichlorosilane, diphenyldichlorosilane, dimethyldibromosilane, diethyldibromosilane, di-n-propyldibromosilane, diisopropyldibromosilane, di-n-butyldibromosilane, di-t-butyldibromosilane, dicyclohexyldibromosilane, diphenethyldibromosilane, di-2-norbornyldibromosilane, divinyldibromosilane, diphenyldibromosilane, dimethyldiiodosilane, diethyldiiodosilane, di-n-propyldiiodosilane, diisopropyldiiodosilane, di-n-butyldiiodosilane, di-t-butyldiiodosilane, dicyclohexyldiiodosilane, diphenethyldiiodosilane, di-2-norbornyldiiodosilane, divinyldiiodosilane, diphenyldiiodosilane, trimethylchlorosilane, triethylchlorosilane, tri-n-propylchlorosilane, triisopropylchlorosilane, tri-n-butylchlorosilane, tri-t-butylchlorosilane, tricyclohexylchlorosilane, triphenethylchlorosilane, tri-2-norbornylchlorosilane, trivinylchlorosilane, triphenylchlorosilane, trimethylbromosilane, triethylbromosilane, tri-n-propylbromosilane, triisopropylbromosilane, tri-n-butylbromosilane, tri-t-butylbromosilane, tricyclohexylbromosilane, triphenethylbromosilane, tri-2-norbornylbromosilane, trivinylbromosilane, triphenylbromosilane, trimethyliodosilane, triethyliodosilane, tri-n-propyliodosilane, triisopropyliodosilane, tri-n-butyliodosilane, tri-t-butyliodosilane, tricyclohexyliodosilane, triphenethyliodosilane, tri-2-norbornyliodosilane, trivinyliodosilane, and triphenyliodosilane. These compounds may be used either individually or in combination of two or more.

As the compound 2, methyltrimethoxysilane, methyltriethoxysilane, methyltri-n-propoxysilane, methyltri-iso-propoxysilane, ethyltrimethoxysilane, ethyltriethoxysilane, vinyltrimethoxysilane, vinyltriethoxysilane, phenyltrimethoxysilane, phenyltriethoxysilane, dimethyldimethoxysilane, dimethyldiethoxysilane, diethyldimethoxysilane, diethyldiethoxysilane, diphenyldimethoxysilane, diphenyldiethoxysilane, and the like are preferable.

These compounds may be used either individually or in combination of two or more.

1.3.2. Compound of General Formula (3) (Hereinafter Also Called "Compound 3")

As examples of the monovalent organic groups represented by $R^4$ and $R^5$ in the general formula (3), the organic groups given as examples for the general formula (2) can be given.

As examples of the compound 3 in which $R^6$ in the general formula (3) is an oxygen atom, hexachlorodisiloxane, hexabromodisiloxane, hexaiodedisiloxane, hexamethoxydisiloxane, hexaethoxydisiloxane, hexaphenoxydisiloxane, 1,1,1,3,3-pentamethoxy-3-methyldisiloxane, 1,1,1,3,3-pentaethoxy-3-methyldisiloxane, 1,1,1,3,3-pentaphenoxy-3-methyldisiloxane, 1,1,1,3,3-pentamethoxy-3-ethyldisiloxane, 1,1,1,3,3-pentaethoxy-3-ethyldisiloxane, 1,1,1,3,3-pentaphenoxy-3-ethyldisiloxane, 1,1,1,3,3-pentamethoxy-3-phenyldisiloxane, 1,1,1,3,3-pentaethoxy-3-phenyldisiloxane, 1,1,1,3,3-pentaphenoxy-3-phenyldisiloxane, 1,1,3,3-tetramethoxy-1,3-dimethyldisiloxane, 1,1,3,3-tetraethoxy-1,3-dimethyldisiloxane, 1,1,3,3-tetraphenoxy-1,3-dimethyldisiloxane, 1,1,3,3-tetramethoxy-1,3-diethyldisiloxane, 1,1,3,3-tetraethoxy-1,3-diethyldisiloxane, 1,1,3,3-tetraphenoxy-1,3-diethyldisiloxane, 1,1,3,3-tetramethoxy-1,3-diphenyldisiloxane, 1,1,3,3-tetraethoxy-1,3-diphenyldisiloxane, 1,1,3,3-tetraphenoxy-1,3-diphenyldisiloxane, 1,1,3-trimethoxy-1,3,3-trimethyldisiloxane, 1,1,3-triethoxy-1,3,3-trimethyldisiloxane, 1,1,3-triphenoxy-1,3,3-trimethyldisiloxane, 1,1,3-trimethoxy-1,3,3-triethyldisiloxane, 1,1,3-triethoxy-1,3,3-triethyldisiloxane, 1,1,3-triphenoxy-1,3,3-triethyldisiloxane, 1,1,3-trimethoxy-1,3,3-triphenyldisiloxane, 1,1,3-triethoxy-1,3,3-triphenyldisiloxane, 1,1,3-triphenoxy-1,3,3-triphenyldisiloxane, 1,3-dimethoxy-1,1,3,3-tetramethyldisiloxane, 1,3-diethoxy-1,1,3,3-tetramethyldisiloxane, 1,3-diphenoxy-1,1,3,3-tetramethyldisiloxane, 1,3-dimethoxy-1,1,3,3-tetraethyldisiloxane, 1,3-diethoxy-1,1,3,3-tetraethyldisiloxane, 1,3-diphenoxy-1,1,3,3-tetraethyldisiloxane, 1,3-dimethoxy-1,1,3,3-tetraphenyldisiloxane, 1,3-diethoxy-1,1,3,3-tetraphenyldisiloxane, 1,3-diphenoxy-1,1,3,3-tetraphenyldisiloxane, and the like can be given.

Of these compounds, hexamethoxydisiloxane, hexaethoxydisiloxane, 1,1,3,3-tetramethoxy-1,3-dimethyldisiloxane, 1,1,3,3-tetraethoxy-1,3-dimethyldisiloxane, 1,1,3,3-tetramethoxy-1,3-diphenyldisiloxane, 1,3-dimethoxy-1,1,3,3-tetramethyldisiloxane, 1,3-diethoxy-1,1,3,3-tetramethyldisiloxane, 1,3-dimethoxy-1,1,3,3-tetraphenyldisiloxane, 1,3-diethoxy-1,1,3,3-tetraphenyldisiloxane, and the like are preferable.

As examples of the compound 3 in which d is zero in the general formula (3), hexachlorodisilane, hexabromodisilane, hexaiodedisilane, hexamethoxydisilane, hexaethoxydisilane, hexaphenoxydisilane, 1,1,1,2,2-pentamethoxy-2-methyldisilane, 1,1,1,2,2-pentaethoxy-2-methyldisilane, 1,1,1,2,2-pentaphenoxy-2-methyldisilane, 1,1,1,2,2-pentamethoxy-2-ethyldisilane, 1,1,1,2,2-pentaethoxy-2-ethyldisilane, 1,1,1,2,2-pentaphenoxy-2-ethyldisilane, 1,1,1,2,2-pentamethoxy-2-phenyldisilane, 1,1,1,2,2-pentaethoxy-2-phenyldisilane, 1,1,1,2,2-pentaphenoxy-2-phenyldisilane, 1,1,2,2-tetramethoxy-1,2-dimethyldisilane, 1,1,2,2-tetraethoxy-1,2-dimethyldisilane, 1,1,2,2-tetraphenoxy-1,2-dimethyldisilane, 1,1,2,2-tetramethoxy-1,2-diethyldisilane, 1,1,2,2-tetraethoxy-1,2-diethyldisilane, 1,1,2,2-tetraphenoxy-1,2-diethyldisilane, 1,1,2,2-tetramethoxy-1,2-diphenyldisilane, 1,1,2,2-tetraethoxy-1,2-diphenyldisilane, 1,1,2, 2-tetraphenoxy-1,2-diphenyldisilane, 1,1,2-trimethoxy-1,2,2-trimethyldisilane, 1,1,2-triethoxy-1,2,2-trimethyldisilane, 1,1,2-triphenoxy-1,2,2-trimethyldisilane, 1,1,2-trimethoxy-1,2,2-triethyldisilane, 1,1,2-triethoxy-1,2,2-triethyldisilane, 1,1,2-triphenoxy-1,2,2-triethyldisilane, 1,1,2-trimethoxy-1,2,2-triphenyldisilane, 1,1,2-triethoxy-1,2,2-triphenyldisilane, 1,1,2-triphenoxy-1,2,2-triphenyldisilane, 1,2-dimethoxy-1,1,2,2-tetramethyldisilane, 1,2-diethoxy-1,1,2,2-tetramethyldisilane, 1,2-diphenoxy-1,1,2,2-tetramethyldisilane, 1,2-dimethoxy-1,1,2,2-tetraethyldisilane, 1,2-diethoxy-1,1,2,2-tetraethyldisilane, 1,2-diphenoxy-1,1,2,2-tetraethyldisilane, 1,2-dimethoxy-1,1,2,2-tetraphenyldisilane, 1,2-diethoxy-1,1,2,2-tetraphenyldisilane, 1,2-diphenoxy-1,1,2,2-tetraphenyldisilane, and the like can be given.

Of these compounds, hexamethoxydisilane, hexaethoxydisilane, 1,1,2,2-tetramethoxy-1,2-dimethyldisilane, 1,1,2,2-tetraethoxy-1,2-dimethyldisilane, 1,1,2,2-tetramethoxy-1,2-diphenyldisilane, 1,2-dimethoxy-1,1,2,2-tetramethyldisilane, 1,2-diethoxy-1,1,2,2-tetramethyldisilane, 1,2-dimethoxy-1,1,2,2-tetraphenyldisilane, 1,2-diethoxy-1,1,2,2-tetraphenyldisilane, and the like are preferable.

As examples of the compound 3 in which $R^6$ in the general formula (3) is the group $-(CH_2)_e-$, bis(trichlorosilyl)methane, bis(tribromosilyl)methane, bis(triiodosilyl)methane, bis(trichlorosilyl)ethane, bis(tribromosilyl)ethane, bis(triiodosilyl)ethane, bis(trimethoxysilyl)methane, bis(triethoxysilyl)methane, bis(tri-n-propoxysilyl)methane, bis(tri-i-propoxysilyl)methane, bis(tri-n-butoxysilyl)methane, bis(tri-sec-butoxysilyl)methane, bis(tri-t-butoxysilyl)methane, 1,2-bis(trimethoxysilyl)ethane, 1,2-bis(triethoxysilyl)ethane, 1,2-bis(tri-n-propoxysilyl)ethane, 1,2-bis(tri-i-propoxysilyl)ethane, 1,2-bis(tri-n-butoxysilyl)ethane, 1,2-bis(tri-sec-butoxysilyl)ethane, 1,1,2,2-bis(tri-t-butoxysilyl)ethane, 1-(dimethoxymethylsilyl)-1-(trimethoxysilyl)methane, 1-(diethoxymethylsilyl)-1-(triethoxysilyl)methane, 1-(di-n-propoxymethylsilyl)-1-(tri-n-propoxysilyl)methane, 1-(di-i-propoxymethylsilyl)-1-(tri-i-propoxysilyl)methane, 1-(di-n-butoxymethylsilyl)-1-(tri-n-butoxysilyl)methane, 1-(di-sec-butoxymethylsilyl)-1-(tri-sec-butoxysilyl)methane, 1-(di-t-butoxymethylsilyl)-1-(tri-t-butoxysilyl)methane, 1-(dimethoxymethylsilyl)-2-(trimethoxysilyl)ethane, 1-(diethoxymethylsilyl)-2-(triethoxysilyl)ethane, 1-(di-n-propoxymethylsilyl)-2-(tri-n-propoxysilyl)ethane, 1-(di-i-propoxymethylsilyl)-2-(tri-i-propoxysilyl)ethane, 1-(di-n-butoxymethylsilyl)-2-(tri-n-butoxysilyl)ethane, 1-(di-sec-butoxymethylsilyl)-2-(tri-sec-butoxysilyl)ethane, 1-(di-t-butoxymethylsilyl)-2-(tri-t-butoxysilyl)ethane, bis(dimethoxymethylsilyl)methane, bis(diethoxymethylsilyl)methane, bis(di-n-propoxymethylsilyl)methane, bis(di-i-propoxymethylsilyl)methane, bis(di-n-butoxymethylsilyl)methane, bis(di-sec-butoxymethylsilyl)methane, bis(di-t-butoxymethylsilyl)methane, 1,2-bis(dimethoxymethylsilyl)ethane, 1,2-bis(diethoxymethylsilyl)ethane, 1,2-bis(di-n-propoxymethylsilyl)ethane, 1,2-bis(di-i-propoxymethylsilyl)ethane, 1,2-bis(di-n-butoxymethylsilyl)ethane, 1,2-bis(di-sec-butoxymethylsilyl)ethane, 1,2-bis(di-t-butoxymethylsilyl)ethane, 1,2-bis(trimethoxysilyl)benzene, 1,2-bis(triethoxysilyl)benzene, 1,2-bis(tri-n-propoxysilyl)benzene, 1,2-bis(tri-i-propoxysilyl)benzene, 1,2-bis(tri-n-butoxysilyl)benzene, 1,2-bis(tri-sec-butoxysilyl)benzene, 1,2-bis(tri-t-butoxysilyl)benzene, 1,3-bis(trimethoxysilyl)benzene, 1,3-bis(triethoxysilyl)benzene, 1,3-bis(tri-n-propoxysilyl)benzene, 1,3-bis(tri-i-propoxysilyl)benzene, 1,3-bis(tri-n-butoxysilyl)benzene, 1,3-bis(tri-sec-butoxysilyl)benzene, 1,3-bis(tri-t-butoxysilyl)benzene, 1,4-bis(trimethoxysilyl)benzene, 1,4-bis(triethoxysilyl)benzene, 1,4-bis(tri-n-propoxysilyl)benzene, 1,4-bis(tri-i-propoxysilyl)benzene, 1,4-bis(tri-n-butoxysilyl)benzene, 1,4-bis(tri-sec-butoxysilyl)benzene, 1,4-bis(tri-t-butoxysilyl)benzene, and the like can be given.

Of these compounds, bis(trimethoxysilyl)methane, bis(triethoxysilyl)methane, 1,2-bis(trimethoxysilyl)ethane, 1,2-bis(triethoxysilyl)ethane, 1-(dimethoxymethylsilyl)-1-(trimethoxysilyl)methane, 1-(diethoxymethylsilyl)-1-(triethoxysilyl)methane, 1-(dimethoxymethylsilyl)-2-(trimethoxysilyl)ethane, 1-(diethoxymethylsilyl)-2-(triethoxysilyl)ethane, bis(dimethoxymethylsilyl)methane, bis(diethoxymethylsilyl)methane, 1,2-bis(dimethoxymethylsilyl)ethane, 1,2-bis(diethoxymethylsilyl)ethane, 1,2-bis(trimethoxysilyl)benzene, 1,2-bis(triethoxysilyl)benzene, 1,3-bis(trimethoxysilyl)benzene, 1,3-bis(triethoxysilyl)benzene, 1,4-bis(trimethoxysilyl)benzene, 1,4-bis(triethoxysilyl)benzene, and the like are preferable.

The compounds 2 and 3 may be used individually or in combination of two or more.

When hydrolyzing and condensing at least one silane compound selected from the group consisting of the compounds 2 and 3 in the presence of at least one of the polycarbosilanes (I) to (III), it is preferable to use water in an amount of more than 0.5 mol and 150 mol or less, and particularly preferably more than 0.5 mol and 130 mol or less for 1 mol of the compounds 2 and 3.

In the production of the polymer, a specific catalyst may be used when hydrolyzing and condensing at least one silane compound selected from the group consisting of the compounds 2 and 3 in the presence of the polycarbosilane (A) (at least one of polycarbosilanes (I) to (III)). As the catalyst, at least one catalyst selected from the group consisting of an alkali catalyst, metal chelate catalyst, and acid catalyst may be used.

As examples of the alkali catalyst, sodium hydroxide, potassium hydroxide, lithium hydroxide, pyridine, pyrrole, piperazine, pyrrolidine, piperidine, picoline, monoethanolamine, diethanolamine, dimethyl monoethanolamine, monomethyldiethanolamine, triethanolamine, diazabicyclooctane, diazabicyclononane, diazabicycloundecene, tetramethylammonium hydroxide, tetraethylammonium hydroxide, tetrapropylammonium hydroxide, tetrabutylammonium hydroxide, ammonia, methylamine, ethylamine, propylamine, butylamine, pentylamine, hexylamine, pentylamine, octylamine, nonylamine, decylamine, N,N-dimethylamine, N,N-diethylamine, N,N-dipropylamine, N,N-dibutylamine, trimethylamine, triethylamine, tripropylamine, tributylamine, cyclohexylamine, trimetylimidine, 1-amino-3-methylbutane, dimethylglycine, 3-amino-3-methylamine, and the like can be given. Of these, the amine or the amine salt is preferable. The organic amine or the organic amine salt is particularly preferable, with the alkylamine and the tetraalkylammonium hydroxide being most preferable. These alkali catalysts may be used either individually or in combination of two or more.

As examples of the metal chelate catalyst, titanium chelate compounds such as
triethoxy.mono(acetylacetonato)titanium,
tri-n-propoxy.mono(acetylacetonato)titanium,
tri-i-propoxy.mono(acetylacetonato)titanium,
tri-n-butoxy.mono(acetylacetonato)titanium,
tri-sec-butoxy.mono(acetylacetonato)titanium,
tri-t-butoxy.mono(acetylacetonato)titanium,
diethoxy.bis(acetylacetonato)titanium,
di-n-propoxy.bis(acetylacetonato)titanium, di-i-propoxy.bis(acetylacetonato)titanium,
di-n-butoxy.bis(acetylacetonato)titanium,
di-sec-butoxy.bis(acetylacetonato)titanium,
di-t-butoxy.bis(acetylacetonato)titanium,
monoethoxy.tris(acetylacetonato)titanium,
mono-n-propoxy.tris(acetylacetonato)titanium,
mono-i-propoxy.tris(acetylacetonato)titanium,
mono-n-butoxy.tris(acetylacetonato)titanium,
mono-sec-butoxy.tris(acetylacetonato)titanium,
mono-t-butoxy.tris(acetylacetonato)titanium,
tetrakis(acetylacetonato)titanium,
triethoxy.mono(ethyl acetoacetate)titanium,
tri-n-propoxy.mono(ethyl acetoacetate)titanium,
tri-i-propoxy.mono(ethyl acetoacetate)titanium,
tri-n-butoxy.mono(ethyl acetoacetate)titanium,
tri-sec-butoxy.mono(ethyl acetoacetate)titanium,
tri-t-butoxy.mono(ethyl acetoacetate)titanium,
diethoxy.bis(ethyl acetoacetate)titanium,
di-n-propoxy.bis(ethyl acetoacetate)titanium,
di-i-propoxy.bis(ethyl acetoacetate)titanium,
di-n-butoxy.bis(ethyl acetoacetate)titanium,
di-sec-butoxy.bis(ethyl acetoacetate)titanium,
di-t-butoxy.bis(ethyl acetoacetate)titanium,
monoethoxy.tris(ethyl acetoacetate)titanium,
mono-n-propoxy.tris(ethyl acetoacetate)titanium,
mono-i-propoxy.tris(ethyl acetoacetate)titanium,
mono-n-butoxy.tris(ethyl acetoacetate)titanium,
mono-sec-butoxy.tris(ethyl acetoacetate)titanium,
mono-t-butoxy.tris(ethyl acetoacetate)titanium,
tetrakis(ethyl acetoacetate)titanium,
mono(acetylacetonato)tris(ethyl acetoacetate)titanium,
bis(acetylacetonato)bis(ethyl acetoacetate)titanium, and
tris(acetylacetonato)mono(ethyl acetoacetate)titanium;

zirconium chelate compounds such as triethoxy.mono(acetylacetonato)zirconium,
tri-n-propoxy.mono(acetylacetonato)zirconium,
tri-i-propoxy.mono(acetylacetonato)zirconium,
tri-n-butoxy.mono(acetylacetonato)zirconium,
tri-sec-butoxy.mono(acetylacetonato)zirconium,
tri-t-butoxy.mono(acetylacetonato)zirconium,
diethoxy.bis(acetylacetonato)zirconium,
di-n-propoxy.bis(acetylacetonato)zirconium,
di-i-propoxy.bis(acetylacetonato)zirconium,
di-n-butoxy.bis(acetylacetonato)zirconium,
di-sec-butoxy.bis(acetylacetonato)zirconium,
di-t-butoxy.bis(acetylacetonato)zirconium,
monoethoxy.tris(acetylacetonato)zirconium,
mono-n-propoxy.tris(acetylacetonato)zirconium,
mono-i-propoxy.tris(acetylacetonato)zirconium,
mono-n-butoxy.tris(acetylacetonato)zirconium,
mono-sec-butoxy.tris(acetylacetonato)zirconium,
mono-t-butoxy.tris(acetylacetonato)zirconium,
tetrakis(acetylacetonato)zirconium,
triethoxy.mono(ethyl acetoacetate)zirconium,
tri-n-propoxy.mono(ethyl acetoacetate)zirconium,
tri-i-propoxy.mono(ethyl acetoacetate)zirconium,
tri-n-butoxy.mono(ethyl acetoacetate)zirconium,
tri-sec-butoxy.mono(ethyl acetoacetate)zirconium,
tri-t-butoxy.mono(ethyl acetoacetate)zirconium,
diethoxy.bis(ethyl acetoacetate)zirconium,
di-n-propoxy.bis(ethyl acetoacetate)zirconium,
di-i-propoxy.bis(ethyl acetoacetate)zirconium,
di-n-butoxy.bis(ethyl acetoacetate)zirconium,
di-sec-butoxy.bis(ethyl acetoacetate)zirconium,
di-t-butoxy.bis(ethyl acetoacetate)zirconium,
monoethoxy.tris(ethyl acetoacetate)zirconium,
mono-n-propoxy.tris(ethyl acetoacetate)zirconium,
mono-i-propoxy.tris(ethyl acetoacetate)zirconium,
mono-n-butoxy.tris(ethyl acetoacetate)zirconium,
mono-sec-butoxy.tris(ethyl acetoacetate)zirconium,
mono-t-butoxy.tris(ethyl acetoacetate)zirconium,
tetrakis(ethyl acetoacetate)zirconium,
mono(acetylacetonato)tris(ethyl acetoacetate)zirconium,
bis(acetylacetonato)bis(ethyl acetoacetate)zirconium, and
tris(acetylacetonato)mono(ethyl acetoacetate)zirconium;

aluminum chelate compounds such as tris(acetylacetonato) aluminum, tris(ethyl acetoacetate)aluminum, and the like can be given.

Of these, the titanium or aluminum chelate compounds are preferable, with the titanium chelate compounds being particularly preferable. These metal chelate catalysts may be used either individually or in combination of two or more.

As examples of the acid catalyst, inorganic acids such as hydrochloric acid, nitric acid, sulfuric acid, hydrofluoric acid, phosphoric acid, and boric acid; and organic acids such as acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, shikimic acid, 2-ethylhexanoic acid, oleic acid, stearic acid, linolic acid, linoleic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid, tartaric acid, succinic acid, fumaric acid, itaconic acid, mesaconic acid, citraconic acid, malic acid, hydrolysate of glutaric acid, hydrolysate of maleic anhydride, and hydrolysate of phthalic anhydride can be given. Of these, the organic carboxylic acids are preferable. These acid catalysts may be used either individually or in combination of two or more.

The above catalyst is used in an amount of usually 0.00001 to 10 mol, and preferably 0.00005 to 5 mol for one mol of the total amount of the groups represented by X, Y, and Z in the compounds 2 and 3. If the amount of the catalyst is in the above range, precipitation or gelation of the polymer occurs to only a small extent during the reaction. In this embodiment, the temperature when hydrolyzing the compounds 2 and 3 is usually 0 to 100° C., and preferably 15 to 80° C.

In this embodiment, the term "complete hydrolysis-condensation product" refers to a product in which the hydrolyzable groups in the polycarbosilane (A) and the compounds 2 and 3 are completely hydrolyzed into SiOH groups and are completely condensed to form a siloxane structure.

The condensation product is preferably a hydrolysis-condensation product of the polycarbosilane (A) and the compound 2 since the resulting composition exhibits excellent storage stability. In this embodiment, the compounds 2 and 3 are used so that the total amount of the compounds 2 and 3 is 500 to 4,000 parts by weight, and preferably 1,000 to 3,000 parts by weight for 100 parts by weight of the polycarbosilane (A).

In this embodiment, the polystyrene-reduced weight average molecular weight of the polymer is preferably 1,500 to 500,000, more preferably 2,000 to 200,000, and still more preferably 2,000 to 100,000. If the polystyrene-reduced weight average molecular weight of the polymer is less than 1,500, the target relative dielectric constant may not be obtained. If the polystyrene-reduced weight average molecular weight of the polymer exceeds 500,000, the resulting coating may exhibit inferior inplane uniformity.

2. Polymer-film-forming Composition (Insulating-film-forming Composition)

The polymer-film-forming composition (insulating-film-forming composition) according to one embodiment of the invention may include the above-described polymer and components such as an organic polymer or a surfactant.

As examples of the organic polymer, a compound having a carbohydrate structure, a vinylamide polymer, a (meth)acrylic polymer, an aromatic vinyl compound, a dendrimer, polyimide, polyamic acid, polyarylene, polyamide, polyquinoxaline, polyoxadiazole, a fluorine-containing polymer, a compound having a polyalkylene oxide structure, and the like can be given.

As examples of the compound having a polyalkylene oxide structure, compounds having a polymethylene oxide structure, polyethylene oxide structure, polypropylene oxide structure, polytetramethylene oxide structure, polybutylene oxide structure, and the like can be given.

As specific examples of the compound having the polyalkylene oxide structure, ether compounds such as a polyoxymethylene alkyl ether, polyoxyethylene alkyl ether, polyoxyethylene alkylphenyl ether, polyoxyethylene sterol ether, polyoxyethylene lanolin derivatives, ethylene oxide derivatives of alkylphenol formalin condensate, polyoxyethylene polyoxypropylene block copolymers, and polyoxyethylene polyoxypropylene alkyl ethers; ether-ester compounds such as polyoxyethylene glyceride, polyoxyethylene sorbitan fatty acid ester, polyoxyethylene sorbitol fatty acid ester, and polyoxyethylene fatty acid alkanolamide sulfate; and ester compounds such as polyethylene glycol fatty acid ester, ethylene glycol fatty acid ester, fatty acid monoglyceride, polyglycerol fatty acid ester, sorbitan fatty acid ester, propylene glycol fatty acid ester, and sucrose fatty acid ester, and the like can be given.

As a polyoxyethylene-polyoxypropylene block copolymer, a compound having the following block structure can be given.

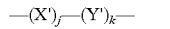

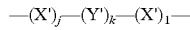

wherein X' represents a group shown by —CH$_2$CH$_2$O—, Y' represents a group shown by —CH$_2$CH(CH$_3$)O—, j represents an integer from 1 to 90, k represents an integer from 10 to 99, and l represents an integer from 0 to 90.

Of these compounds, the ether compounds such as the polyoxyethylene alkyl ether, polyoxyethylene-polyoxypropylene block copolymer, polyoxyethylene polyoxypropylene alkyl ether, polyoxyethylene glyceride, polyoxyethylene sorbitan fatty acid ester, and polyoxyethylene sorbitol fatty acid ester are preferable. These compounds may be used either individually or in combination of two or more.

As examples of the surfactant, a nonionic surfactant, anionic surfactant, cationic surfactant, amphoteric surfactant, and the like can be given. The surfactant may be a fluorine-containing surfactant, silicone surfactant, polyalkylene oxide surfactant, poly(meth)acrylate surfactant, or the like. Of these, the fluorine-containing surfactant and the silicone surfactant are preferable.

As examples of the fluorine-containing surfactant, compounds having a fluoroalkyl or fluoroalkylene group in at least one of the molecular terminal, main chain, and side chain, such as 1,1,2,2-tetrafluorooctyl (1,1,2,2-tetrafluoropropyl) ether, 1,1,2,2-tetrafluorooctyl hexyl ether, octaethylene glycol di(1,1,2,2-tetrafluorobutyl) ether, hexaethylene glycol (1,1,2,2,3,3-hexafluoropropyl) ether, octapropylene glycol di(1,1,2,2-tetrafluorobutyl) ether, hexapropylene glycol di(1,1,2,2,3,3-hexafluoropropyl) ether, sodium perfluorododecylsulfonate, 1,1,2,2,8,8,9,9,10,10-decafluorododecane, 1,1,2,2,3,3-hexafluorodecane, N-[3-(perfluorooctanesulfonamide)-propyl]-N,N'-dimethyl-N-carboxymethylene ammonium betaine, perfluoroalkylsulfonamide propyltrimethyl ammonium salt, perfluoroalkyl-N-ethylsulfonyl glycine salt, bis(N-perfluorooctylsulfonyl-N-ethylaminoethyl) phosphate, and monoperfluoroalkylethyl phosphate can be given.

As examples of commercially available products of the fluorine-containing surfactant, Megafac F142D, F172, F173, F183 (manufactured by Dainippon Ink and Chemicals, Inc.), Eftop EF301, EF303, EF352 (manufactured by Sin-Akita Kasei Co., Ltd.). Fluorad FC-430, FC-431 (manufactured by Sumitomo 3M Ltd.), Asahi Guard AG710, Surflon S-382, SC-101, SC-102, SC-103, SC-104, SC-105, SC-106 (manufactured by Asahi Glass Co., Ltd.), BM-1000, BM-1100 (manufactured by BM Chemie), NBX-15 (manufactured by NEOS Co., Ltd.), and the like can be given. Of these, Megafac F172, BM-1000, BM-1100, and NBX-15 are particularly preferable.

As the silicone surfactant, SH7PA, SH21PA, SH30PA, ST94PA (manufactured by Dow Corning Toray Silicone Co., Ltd.), and the like may be used. Of these, SH28PA and SH30PA are preferable.

The surfactant is usually used in an amount of 0.0001 to 10 parts by weight for 100 parts by weight of the polymer (complete hydrolysis-condensation product). The surfactant may be used either individually or in combination of two or more.

In the insulating-film-forming composition, the above-described polymer (hydrolysis-condensation product) may be dissolved or dispersed in an organic solvent together with an optional additive.

As examples of the organic solvent, at least one solvent selected from the group consisting of an alcohol solvent, ketone solvent, amide solvent, ester solvent, and nonprotic solvent can be given.

Examples of the alcohol solvent include monohydric alcohols such as methanol, ethanol, n-propanol, i-propanol, n-butanol, i-butanol, sec-butanol, t-butanol, n-pentanol, i-pentanol, 2-methylbutanol, sec-pentanol, t-pentanol, 3-methoxybutanol, n-hexanol, 2-methylpentanol, sec-hexanol, 2-ethylbutanol, sec-heptanol, 3-heptanol, n-octanol, 2-ethylhexanol, sec-octanol, n-nonyl alcohol, 2,6-dimethyl-4-heptanol, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, and diacetone alcohol; polyhydric alcohols such as ethylene glycol, 1,2-polyethylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, and tripropylene glycol; polyhydric alcohol partial ether solvents such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethylbutyl ether, diethylene glycol monomethyl ether, diethylene glycol monoethyl ether, diethylene glycol monopropyl ether, diethylene glycol monobutyl ether, diethylene glycol monohexyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, and dipropylene glycol monopropyl ether.

These alcohol solvents may be used either individually or in combination of two or more.

Examples of the ketone solvent include acetone, methyl ethyl ketone, methyl n-propyl ketone, methyl n-butyl ketone, diethyl ketone, methyl i-butyl ketone, methyl n-pentyl ketone, ethyl n-butyl ketone, methyl n-hexyl ketone, di-i-butyl ketone, trimethylnonane, cyclohexanone, 2-hexanone, methylcyclohexanone, 2,4-pentanedione, acetonylacetone, acetophenone, and fenchone; beta-diketones such as acetylacetone, 2,4-hexanedione, 2,4-heptanedione, 3,5-heptanedione, 2,4-octanedione, 3,5-octanedione, 2,4-nonanedione, 3,5-nonanedione, 5-methyl-2,4-hexanedione, 2,2,6,6-tetramethyl-3,5-heptanedione, and 1,1,1,5,5,5-hexafluoro-2,4-heptanedione; and the like. These ketone solvents may be used either individually or in combination of two or more.

Examples of the amide solvent include formamide, N-methylformamide, N,N-dimethylformamide, N-ethylformamide, N,N-diethylformamide, acetamide, N-methylacetamide, N,N-dimethylacetamide, N-ethylacetamide, N,N-diethylacetamide, N-methylpropioneamide, N-methylpyrrolidone, N-formylmorpholine, N-formylpiperidine, N-formylpyrrolidine, N-acetylmorpholine, N-acetylpiperidine, N-acetylpyrrolidine, and the like. These amide solvents may be used either individually or in combination of two or more.

Examples of the ester solvent include diethyl carbonate, ethylene carbonate, propylene carbonate, diethyl carbonate, methyl acetate, ethyl acetate, gamma-butyrolactone, gamma-valerolactone, n-propyl acetate, i-propyl acetate, n-butyl acetate, i-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxy triglycol acetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate, diethyl phthalate, and the like. These ester solvents may be used either individually or in combination of two or more.

Examples of the nonprotic solvent include acetonitrile, dimethylsulfoxide, N,N,N',N'-tetraethylsulfonamide, hexamethylphosphoric acid triamide, N-methylmorphorone, N-methylpyrrole, N-ethylpyrrole, N-methyl-3-pyrroline, N-methylpiperidine, N-ethylpiperidine, N,N-dimethylpiperazine, N-methylimidazole, N-methyl-4-piperidone, N-methyl-2-piperidone, N-methyl-2-pyrrolidone, 1,3-dimethyl-2-imidazolidinone, 1,3-dimethyltetrahydro-2(1H)-pyrimidinone, and the like. These nonprotic solvents may be used either individually or in combination of two or more.

The total solid content of the insulating-film-forming composition thus obtained may be appropriately adjusted according to the target application. The total solid content is preferably 2 to 30 wt %. If the total solid content of the insulating-film-forming composition is 2 to 30 wt %, the resulting coating has an appropriate thickness, and the composition exhibits excellent storage stability. The total solid content may be adjusted by concentration or dilution with the above organic solvent, as required.

3. Polymer Film (Insulating Film)

The polymer film according to one embodiment of the invention is obtained by applying the above-described insulating-film-forming composition to a substrate to form a coating, and heating the resulting coating.

When applying the above-described insulating-film-forming composition to a substrate such as a silicon wafer, $SiO_2$ wafer, or SiN wafer, the film-forming composition is applied by spin coating, dip coating, roll coating, spraying, or the like.

A coating with a dry thickness of about 0.05 to 2.5 micrometers may be obtained by single application, and a coating with a dry thickness of about 0.1 to 5.0 micrometers may be obtained by double application. The coating is then dried at an ordinary temperature or dried by heating at about 80 to 600° C. for 5 to 240 minutes to form a glass-like or high-molecular-weight polymer coating.

As the heating method, a hot plate, oven, furnace, or the like may be used. The coating may be heated in air, nitrogen, or argon, under vacuum, or under reduced pressure in which the oxygen concentration is controlled.

In order to control the curing speed of the coating, the coating may be heated stepwise, or the atmosphere such as nitrogen, air, oxygen, and reduced pressure may be selected, if necessary.

In this embodiment, the insulating-film-forming composition may be applied to a substrate and heated at 30 to 450° C. while applying high-energy rays.

The silica-based polymer film according to this embodiment of the invention thus obtained has a density of usually 0.35 to 1.2 $g/cm^3$, preferably 0.4 to 1.1 $g/cm^3$, and still more preferably 0.5 to 1.0 $g/cm^3$. If the density of the film is less than 0.35 $g/cm^3$, the coating may exhibit insufficient mechanical strength. If the density of the film is more than 1.2 $g/cm^3$, a low relative dielectric constant may not be obtained. The relative dielectric constant of the polymer film is usually 1.2 to 3.2, preferably 1.5 to 3.0, and still more preferably 2.7 to 1.8.

The polymer film in this embodiment includes a number of silicon-carbon bonds in the film structure. This ensures excellent insulating properties, excellent coating uniformity, excellent dielectric constant properties, excellent modulus of elasticity, and adhesion of the coating.

Since the polymer film in this embodiment exhibits a low relative dielectric constant and excellent crack resistance, mechanical strength, and adhesion, the insulating film according to this embodiment is useful for applications such as an interlayer dielectric or an etching stopper film for semiconductor devices such as an LSI, system LSI, DRAM, SDRAM, RDRAM, and D-RDRAM, a protective film such as a surface coating film for semiconductor devices, an intermediate layer used in the semiconductor manufacture using a multilayer resist, an interlayer dielectric for multilayer wiring boards, and a protective film or an insulating film for liquid crystal display devices.

4. EXAMPLES

The invention is described below in more detail by way of examples. Note that the invention is not limited to the following examples. In the examples and comparative examples, "part" and "%" respectively refer to "part by weight" and "wt %" unless otherwise indicated.

4.1. Evaluation Method

Each item was evaluated as follows.

4.1.1. Weight Average Molecular Weight (Mw) of Polymer

The weight average molecular weight (Mw) of the polymer was measured by gel permeation chromatography (GPC) under the following conditions.
Sample: A sample was prepared by dissolving 1 g of the polymer (hydrolysis-condensation product) in 100 cc of tetrahydrofuran (solvent). Standard polystyrene: standard polystyrene manufactured by Pressure Chemical Company
Instrument: high-temperature high-speed gel permeation chromatogram (Model 150-C ALC/GPC) manufactured by Waters Corporation
Column: SHODEX A-80M (length: 50 cm) manufactured by Showa Denko K. K. Measurement temperature: 40° C.
Flow rate: 1 cc/min

4.1.2. Relative Dielectric Constant

A relative dielectric constant measurement sample was prepared by forming an aluminum electrode pattern on the resulting polymer film by deposition. The relative dielectric constant of the sample was measured at room temperature by a CV method at a frequency of 100 kHz using an electrode "HP16451B" and a precision LCR meter "HP4284A" manufactured by Yokogawa-Hewlett-Packard, Ltd.

4.1.3. Mechanical Strength (Modulus of Elasticity and Hardness)

The modulus of elasticity and the hardness of the resulting insulating film were measured by a continuous stiffness measurement method using a Nano Indenter XP (manufactured by Nano Instruments).

4.1.4. Adhesion

An $SiO_2$ film was formed on the resulting polymer film by sputtering to a thickness of 400 nm. The $SiO_2$ film was cut to an appropriate size. A blank silicon wafer of the same size was bonded to the wafer using an epoxy resin, and heated at 135° C. for two hours in an oven. The resulting product was cut into small pieces using a dicing machine. Each piece was then subjected to a peeling test using a four-point bend adhesion measurement method. The results were classified as follows.
A: The adhesion energy was 3.0 J/m$^2$ or more.
B: The adhesion energy was less than 3.0 J/m$^2$.

4.1.5. Phase Separation in Film

The cross section of the polymer film was processed for observation by a focused ion beam method, and the outward appearance of the cross section was observed using a transmission electron microscope (TEM) at a magnification of 18,000. The observation results were classified as follows.
A: A coating with a uniform cross-sectional shape was observed.
B: An island-like domain phase separation was observed in the coating.

4.2. Synthesis Example of Polycarbosilane (A)

4.2.1. Synthesis Example 1

A 3-liter four-neck flask equipped with a thermometer, condenser, dripping funnel, and stirrer, of which the atmosphere was replaced with argon gas, was charged with 1 liter of dry tetrahydrofuran and 60 g of magnesium. Argon gas was then bubbled into the mixture. A mixture of 143 g of chloromethyldimethylchlorosilane and 82 g of chloromethylmethyldichlorosilane was slowly added to the mixture from the dripping funnel with stirring at 20° C.
After the addition, the mixture was stirred at 45° C. for three hours. A supernatant of the reaction system was added to a solution prepared by suspending 10 g of $LiAlH_4$ in 300 ml of dry tetrahydrofuran, and the mixture was allowed to react at room temperature for five hours.
The reaction mixture was then added to 15 liters of iced water to precipitate the polymer. The polymer was washed well with water and dried under vacuum to obtain 65 g of a brown solid polymer (1).
The weight average molecular weight of the polymer thus obtained was 11,000.

4.2.2. Synthesis Example 2

A 3-liter four-neck flask equipped with a thermometer, condenser, dripping funnel, and stirrer, of which the atmosphere was replaced with argon gas, was charged with 1 liter of dry tetrahydrofuran and 60 g of magnesium. Argon gas was then bubbled into the mixture. A mixture of 72 g of chloromethyldimethylchlorosilane and 163 g of chloromethylmethyldichlorosilane was slowly added to the mixture from the dripping funnel with stirring at 20° C.
After the addition, the mixture was stirred at 45° C. for three hours. A supernatant of the reaction system was added to a solution prepared by suspending 10 g of $LiAlH_4$ in 300 ml of dry tetrahydrofuran, and the mixture was allowed to react at room temperature for five hours.
The reaction mixture was then added to 15 liters of iced water to precipitate the polymer. The polymer was washed well with water and dried under vacuum to obtain 68 g of a brown solid polymer (2).
The weight average molecular weight of the polymer thus obtained was 4,000.

4.2.3. Synthesis Example 3

A 3-liter four-neck flask equipped with a thermometer, condenser, dripping funnel, and stirrer, of which the atmosphere was replaced with argon gas, was charged with 1 liter of dry tetrahydrofuran and 60 g of magnesium. Argon gas was then bubbled into the mixture. 79 g of chloromethyltrichlorosilane and was slowly added to the mixture from the dripping funnel with stirring at 20° C. After the addition, the mixture was stirred at 45° C. for three hours. An inorganic salt was removed from the reaction system by filtration. The filtrate was concentrated under reduced pressure and dried under vacuum.
The reaction product was added to a four-neck flask charged with 200 g of toluene and 190 g of triethylamine, and 150 ml of methanol was slowly added to the mixture from a dripping funnel. After the addition, the mixture was stirred at room temperature for two hours. A salt produced was then removed using a glass filter. The filtrate was concentrated under reduced pressure and dried under vacuum to obtain 52 g of a white solid polymer (3).

The weight average molecular weight of the polymer thus obtained was 7,100.

4.2.4. Synthesis Example 4

A 4-liter four-neck flask equipped with a thermometer, condenser, dripping funnel, and stirrer, of which the atmosphere was replaced with argon gas, was charged with 1.5 liters of dry tetrahydrofuran and 71 g of magnesium. Argon gas was then bubbled into the mixture. 500 g of chloromethyltriethoxysilane was slowly added to the mixture from the dripping funnel with stirring at 20° C.

After the addition, the mixture was stirred at 0° C. for 12 hours. After the addition of hexane to the reaction liquid, the mixture was filtered through celite. The organic solvent was completely removed by drying the filtrate under vacuum using a vacuum oven to obtain 414 g of a brown liquid polymer (4).

The weight average molecular weight of the resulting polymer (4) was 420.

4.3. Examples and Comparative Examples

4.3.1. Example 1

In a separable flask made of quartz, 5.0 g of the polymer (1) obtained in Synthesis Example 1, 22 g of methyltrimethoxysilane, 28 g of tetraethoxysilane, and 0.0029 g of triethylamine were dissolved in 249 g of methanol. The mixture was stirred using a three-one motor, and the solution temperature was stabilized at 55° C. Then, a mixed solution of 50.1 g of ion-exchanged water and 202 g of propylene glycol monoethyl ether was added to the solution over one hour. After allowing the mixture to react at 55° C. for four hours, 10 g of a 10% propylene glycol monopropyl ether solution of acetic acid was added to the mixture. After allowing the mixture to react for 30 minutes, the reaction liquid was cooled to room temperature. 299 g of a solution containing methanol and water was evaporated from the reaction liquid at 50° C. to obtain a reaction liquid A. The weight average molecular weight of the condensate thus obtained was 22,000.

4.3.2. Example 2

In a separable flask made of quartz, 5.0 g of the polymer (2) obtained in Synthesis Example 2 and 51 g of methyltrimethoxysilane were dissolved in 252 g of methanol. The mixture was stirred using a three-one motor, and the solution temperature was stabilized at 55° C. Then, a mixed solution of 50.2 g of ion-exchanged water, 200 g of propylene glycol monoethyl ether, 0.0112 g of a 25% tetramethylammonium hydroxide aqueous solution was added to the solution over one hour. After allowing the mixture to react at 55° C. for four hours, 10 g of a 10% propylene glycol monopropyl ether solution of acetic acid was added to the mixture. After allowing the mixture to react for 30 minutes, the reaction liquid was cooled to room temperature. 298 g of a solution containing methanol and water was evaporated from the reaction liquid at 50° C. to obtain a reaction liquid B. The weight average molecular weight of the condensate thus obtained was 12,000.

4.3.3. Example 3

In a separable flask made of quartz, 5.0 g of the polymer (1) obtained in Synthesis Example 1 and 50 g of tetraethoxysilane were dissolved in 250 g of methanol. The mixture was stirred using a three-one motor, and the solution temperature was stabilized at 55° C. Then, a mixed solution of 50.3 g of ion-exchanged water, 201 g of propylene glycol monoethyl ether, and 0.0080 g of a 40% methylamine aqueous solution was added to the solution over one hour. After allowing the mixture to react at 55° C. for four hours, 10 g of a 10% propylene glycol monopropyl ether solution of acetic acid was added to the mixture. After allowing the mixture to react for 30 minutes, the reaction liquid was cooled to room temperature.

298 g of a solution containing methanol and water was evaporated from the reaction liquid at 50° C. to obtain a reaction liquid C. The weight average molecular weight of the condensate thus obtained was 26,000.

4.3.4. Example 4

In a separable flask made of quartz, 5.0 g of the polymer (2) obtained in Synthesis Example 2, 51 g of tetraethoxysilane and 0.0029 g of triethylamine were dissolved in 250 g of methanol. The mixture was stirred using a three-one motor, and the solution temperature was stabilized at 55° C. Then, a mixed solution of 50.0 g of ion-exchanged water and 201 g of propylene glycol monoethyl ether was added to the solution over one hour.

After allowing the mixture to react at 55° C. for four hours, 10 g of a 10% propylene glycol monopropyl ether solution of oxalic acid was added to the mixture. After allowing the mixture to react for 30 minutes, the reaction liquid was cooled to room temperature. 297 g of a solution containing methanol and water was evaporated from the reaction liquid at 50° C. to obtain a reaction liquid D. The weight average molecular weight of the condensate thus obtained was 15,000.

4.3.5. Example 5

In a separable flask made of quartz, 4.6 g of the polymer (3) obtained in Synthesis Example 3, 53 g of methyltrimethoxysilane, and 0.0054 g of triethylamine were dissolved in 246 g of methanol. The mixture was stirred using a three-one motor, and the solution temperature was stabilized at 55° C. Then, a mixed solution of 51.4 g of ion-exchanged water and 201 g of propylene glycol monoethyl ether was added to the solution in one hour.

After allowing the mixture to react at 55° C. for four hours, 10 g of a 10% propylene glycol monopropyl ether solution of acetic acid was added to the mixture. After allowing the mixture to react for 30 minutes, the reaction liquid was cooled to room temperature. 297 g of a solution containing methanol and water was evaporated from the reaction liquid at 50° C. to obtain a reaction liquid E. The weight average molecular weight of the condensate thus obtained was 19,000.

4.3.6. Example 6

The reaction liquid A obtained in Example 1 was filtered through a Teflon (registered trademark) filter with a pore size of 0.2 micrometers to obtain the above-described insulating-film-forming composition.

The resulting composition was applied to a silicon wafer by spin coating. The substrate was dried on a hot plate at 90° C. for three minutes and at 200° C. for three minutes in a nitrogen atmosphere, and sintered on a hot plate at 400° C. for 60 minutes in a nitrogen atmosphere. The resulting polymer film (hereinafter called "silica-based film") was evaluated according to the evaluation methods described in 4.1. The evaluation results are shown in Table 1.

4.3.7. Examples 7 to 10

Silica-based films were respectively formed in the same manner as in Example 6 except for using the reaction liquids B, C, D, and E instead of the reaction. liquid A. The evaluation results are shown in Table 1.

4.3.8. Comparative Example 1

A silica-based film was formed in the same manner as in Example 6 except for using a reaction liquid F prepared by dissolving 1.0 g of the polymer (1) obtained in Synthesis Example 1 in 4.0 g of propylene glycol monopropyl ether as the coating solution. The resulting silica-based film was evaluated. The evaluation results are shown in Table 1.

4.3.9. Comparative Example 2

A separable flask made of quartz was charged with 430 g of distilled ethanol, 211 g of ion-exchanged water, and 15.2 g of a 25% tetramethylammonium hydroxide aqueous solution. The mixture was then uniformly stirred. Then, a mixture of 40 g of methyltrimethoxysilane and 61.1 g of tetraethoxysilane was added to the solution. The mixture was allowed to react at 60° C. for two hours. After the addition of 300 g of propylene glycol monopropyl ether, the solution was concentrated at 50° C. using an evaporator until the solid content became 20% (as complete hydrolysis-condensation product). Then, 20 g of a 10% propylene glycol monopropyl ether solution of maleic acid was added to the concentrate to obtain a reaction liquid G. A silica-based film was formed in the same manner as in Example 6 except for using the reaction liquid G instead of the reaction liquid A. The resulting silica-based film was evaluated. The evaluation results are shown in Table 1.

4.3.10. Comparative Example 3

A 25% propylene glycol monopropyl ether solution of polycarbosilane (weight average molecular weight: 20,000) containing a repeating unit of the formula "—[Si($CH_3$)(H)—$CH_2$]—" (hereinafter called "reaction liquid J") and the reaction liquid E obtained in Comparative Example 2 were mixed at a weight ratio of J:E=2:8 to obtain a reaction liquid F. A silica-based film was formed in the same manner as in Example 6 except for using the reaction liquid F instead of the reaction liquid A. The resulting silica-based film was evaluated. The evaluation results are shown in Table 1.

4.3.11. Comparative Example 4

9 g of the polymer (4) obtained in Synthesis Example 4, 30 g of methyltrimethoxysilane, and 3.4 g of tetramethoxysilane were mixed with 60 ml of tetrahydrofuran. After cooling the mixed solution to 0° C., 37 ml of 0.01N nitric acid was slowly added to the mixed solution. The mixture was then allowed to react for 30 minutes. After heating the mixture to 70° C., the mixture was allowed to react for 16 hours under reflux. The reaction liquid was then allowed to cool and diluted with 250 ml of diethyl ether. The resulting solution was washed with distilled water three to four times until the pH of the solution became neutral. After the addition of 200 g of propylene glycol monopropyl ether to the solution, the mixture was concentrated at 50° C. using an evaporator until the solid content became 20% (as complete hydrolysis-condensation product). Then, 20 g of a 10% propylene glycol monopropyl ether solution of maleic acid was added to the concentrate to obtain a reaction liquid I. A silica-based film was formed in the same manner as in Example 6 except for using the reaction liquid I instead of the reaction liquid A. The resulting silica-based film was evaluated. The evaluation results are shown in Table 1.

TABLE 1

| | Reaction liquid | Coating treatment condition | Thickness (μm) | Relative dielectric constant | Modulus of elasticity (GPa) | Hardness (GPa) | Adhesion | TEM observation |
|---|---|---|---|---|---|---|---|---|
| Example 6 | A | Heating/sintering | 0.50 | 2.46 | 8.9 | 0.9 | A | A |
| Example 7 | B | Heating/sintering | 0.50 | 2.55 | 8.7 | 1.0 | A | A |
| Example 8 | C | Heating/sintering | 0.50 | 2.59 | 8.8 | 0.8 | A | A |
| Example 9 | D | Heating/sintering | 0.50 | 2.91 | 9.6 | 1.0 | A | A |
| Example 10 | E | Heating/sintering | 0.50 | 2.62 | 9.3 | 0.9 | A | A |
| Comparative Example 1 | F | Heating/sintering | 0.50 | 2.92 | 7.4 | 0.6 | A | A |
| Comparative Example 2 | G | Heating/sintering | 0.50 | 2.86 | 7.2 | 0.7 | B | A |
| Comparative Example 3 | H | Heating/sintering | 0.50 | 2.90 | 8.1 | 0.6 | A | B |
| Comparative Example 4 | I | Heating/sintering | 0.50 | 3.10 | 9.1 | 0.9 | B | A |

What is claimed is:

1. A method of producing a polymer, comprising hydrolyzing and condensing a hydrolyzable-group-containing silane monomer (B) with a polycarbosilane (A) obtained by reacting a polycarbosilane (I) with an alcohol or an organic acid in an organic solvent, the polycarbosilane (I) having a weight average molecular weight of 500 or more and obtained by reacting a compound of the following general formula (1) in the presence of at least one of an alkali metal and an alkaline earth metal, $$R^1{}_m Y_{3-m} SiCR^2{}_n X_{3-n} \quad (1)$$

wherein $R^1$ and $R^2$ individually represent a monovalent organic group or a hydrogen atom, X represents a halogen atom, Y represents a halogen atom or an alkoxy group, and m and n individually represent integers from 0 to 2.

2. A method of producing a polymer, comprising obtaining a polycarbosilane (A) by reacting a polycarbosilane (I) with a reducing agent in an organic solvent, the polycarbosilane (I) having a weight average molecular weight of 500 or more and obtained by reacting a compound of the following general formula (1) in the presence of at least one of an alkali metal and an alkaline earth metal, and hydrolyzing and condensing a hydrolyzable-group-containing silane monomer (B) with the polycarbosilane (A), $$R^1_m Y_{3-m} SiCR^2_n X_{3-n} \qquad (1)$$

wherein $R^1$ and $R^2$ individually represent a monovalent organic group or a hydrogen atom, X represents a halogen atom, Y represents a halogen atom or an alkoxy group, and m and n individually represent integers from 0 to 2.

3. The method according to claim 1, wherein the hydrolyzable-group-containing silane monomer (B) is at least one silane compound selected from the group consisting of a compound of the following general formula (2), $$R^3_a SiX_{4-a} \qquad (2)$$

wherein $R^3$ represents a hydrogen atom, a fluorine atom, or a monovalent organic group, X represents a halogen atom or an alkoxy group, and a represents an integer from 0 to 3, and a compound of the following general formula (3), $$R^4_b Y_{3-b} Si-(R^6)_d-SiZ_{3-c} R^5_c \qquad (3)$$

wherein $R^4$ and $R^5$ individually represent monovalent organic groups, b and c individually represent integers from 0 to 2, $R^6$ represents an oxygen atom, a phenylene group, or a group $-(CH_2)_e-$ (wherein e represents an integer from 1 to 6), Y and Z individually represent a halogen atom or an alkoxy group, and d represents 0 or 1.

4. The method according to claim 2, wherein the hydrolyzable-group-containing silane monomer (B) is at least one silane compound selected from the group consisting of a compound of the following general formula (2), $$R^3_a SiX_{4-a} \qquad (2)$$

wherein $R^3$ represents a hydrogen atom, a fluorine atom, or a monovalent organic group, X represents a halogen atom or an alkoxy group, and a represents an integer from 0 to 3, and a compound of the following general formula (3), $$R^4_b Y_{3-b} Si-(R^6)_d-SiZ_{3-c} R^5_c \qquad (3)$$

wherein $R^4$ and $R^5$ individually represent monovalent organic groups, b and c individually represent integers from 0 to 2, $R^6$ represents an oxygen atom, a phenylene group, or a group $-(CH_2)_e-$ (wherein e represents an integer from 1 to 6), Y and Z individually represent a halogen atom or an alkoxy group, and d represents 0 or 1.

5. The method according to claim 2, wherein said hydrolyzing and condensing is performed in the presence of an alkylamine, a tetraalkylammonium hydroxide or a combination thereof.

* * * * *